United States Patent
Hwang et al.

(10) Patent No.: US 11,237,908 B2
(45) Date of Patent: Feb. 1, 2022

(54) MEMORY SYSTEM AND OPERATING METHOD THEREOF

(71) Applicant: SK hynix Inc., Gyeonggi-do (KR)

(72) Inventors: Nam Oh Hwang, Seoul (KR);
Yong-Tae Kim, Gyeonggi-do (KR);
Soong-Sun Shin, Gyeonggi-do (KR);
Duck-Hoi Koo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/799,526

(22) Filed: Feb. 24, 2020

(65) Prior Publication Data
US 2020/0192759 A1 Jun. 18, 2020

Related U.S. Application Data

(63) Continuation-in-part of application No. 15/961,210, filed on Apr. 24, 2018, now Pat. No. 10,573,380, and (Continued)

(30) Foreign Application Priority Data

Mar. 29, 2017 (KR) .................. 10-2017-0039915
Sep. 13, 2017 (KR) .................. 10-2017-0116943

(51) Int. Cl.
*G06F 11/14* (2006.01)
*G06F 11/10* (2006.01)
(Continued)

(52) U.S. Cl.
CPC ........ *G06F 11/1402* (2013.01); *G06F 11/102* (2013.01); *G06F 11/1048* (2013.01);
(Continued)

(58) Field of Classification Search
CPC ............ G06F 11/1402; G06F 11/1048; G06F 11/102; G06F 11/141; G11C 16/26;
(Continued)

(56) References Cited

U.S. PATENT DOCUMENTS 7,613,045 B2    11/2009  Murin et al.
9,412,471 B2     8/2016  Kim et al.
(Continued)

FOREIGN PATENT DOCUMENTS

CN    1949368 A      4/2007
CN  106205731 A     12/2016
(Continued)

OTHER PUBLICATIONS

Office Action issued by the USPTO for U.S. Appl. No. 16/532,965 in the same family tree dated Aug. 27, 2020.
(Continued)

*Primary Examiner* — Amir Zarabian
*Assistant Examiner* — Minh Dinh
(74) *Attorney, Agent, or Firm* — IP & T Group LLP

(57) ABSTRACT

There are provided a memory system and an operating method thereof. A memory system includes: a plurality of storage regions, each including a plurality of memory cells; and a controller configured to provide a plurality of read retry sets, determine an applying order of the plurality of read retry sets based on characteristics of a read error occurred in a first storage region among the plurality of storage regions, and apply at least one of the read retry sets, based on the applying order, for a read retry operation performed on the first storage region.

12 Claims, 27 Drawing Sheets

Related U.S. Application Data a continuation-in-part of application No. 16/532,965, filed on Aug. 6, 2019, now Pat. No. 11,086,720, which is a continuation of application No. 15/813,502, filed on Nov. 15, 2017, now Pat. No. 10,379,955.

(51) Int. Cl.
　　*G11C 16/26*　　(2006.01)
　　*G11C 16/34*　　(2006.01)
　　*G11B 20/10*　　(2006.01)
　　*G11B 20/18*　　(2006.01)

(52) U.S. Cl.
　　CPC ...... *G06F 11/141* (2013.01); *G11B 20/10388* (2013.01); *G11C 16/26* (2013.01); *G11C 16/3431* (2013.01); *G11B 2020/183* (2013.01)

(58) Field of Classification Search
　　CPC . G11C 16/3431; G11C 29/021; G11C 29/028; G11C 29/52; G11C 29/44; G11C 2211/5644; G11C 2211/5631; G11C 16/08; G11C 16/349; G11C 7/04; G11C 11/5642; G11C 16/0483; G11B 20/10388; G11B 2020/183
　　USPC .......................................................... 714/746
　　See application file for complete search history.

(56) References Cited

U.S. PATENT DOCUMENTS

| | | | |
|---|---|---|---|
| 9,472,275 B2 | 10/2016 | Park et al. | |
| 10,379,955 B2 * | 8/2019 | Kim | G11C 16/26 |
| 10,573,380 B2 * | 2/2020 | Hwang | G11C 16/28 |
| 2007/0011581 A1 | 1/2007 | Nakanishi et al. | |
| 2012/0236656 A1 | 9/2012 | Cometti | |
| 2014/0047269 A1 * | 2/2014 | Kim | G06F 11/1402 |
| | | | 714/16 |
| 2015/0188575 A1 | 7/2015 | Chou | |
| 2016/0170871 A1 * | 6/2016 | Hyun | G06F 3/0653 |
| | | | 711/103 |
| 2016/0357472 A1 * | 12/2016 | Choi | G06F 11/1048 |

FOREIGN PATENT DOCUMENTS

| | | |
|---|---|---|
| CN | 106251903 A | 12/2016 |
| KR | 10-2014-0014547 | 2/2014 |
| KR | 10-2015-0018921 A | 2/2015 |
| KR | 10-2015-0029404 | 3/2015 |
| KR | 10-2017-0036544 A | 4/2017 |
| TW | 200907978 A | 2/2009 |
| TW | 201437806 A | 10/2014 |

OTHER PUBLICATIONS

Office Action issued by the China National Intellectual Property Administration dated Oct. 14, 2020.

Office Action issued by the Korean Intellectual Property Office dated Apr. 19, 2021.

Granted Chinese Invention issued by the China National Intellectual Property Administration dated Jun. 1, 2021.

Office Action issued by the Taiwan Intellectual Property Office dated Aug. 11, 2021.

Office Action issued by the Korean Intellectual Property Office dated Oct. 25, 2021.

* cited by examiner

FIG. 10

Loop 1:
  Step 1. read LSB/MSB at −100 mv offset @R1, R2, R3
  Step 2. count a number of memory cells of each threshold voltage state MSB page : 1001 0010 1010 0111 0001
  LSB page : 0101 1000 1101 1001 1010

STATE COUNTER ⇒

| State | 11 | 10 | 00 | 01 |
  |-------|----|----|----|----|
  | Count | 3  | 6  | 4  | 7  |

Loop 2:
  Step 1. read LSB/MSB at −80 mv offset @R1, R2, R3
  Step 2. count a number of memory cells of each threshold voltage state MSB page : 1011 0010 1010 0111 0001
  LSB page : 1101 1000 1101 1011 0010

STATE COUNTER ⇒

| State | 11 | 10 | 00 | 01 |
  |-------|----|----|----|----|
  | Count | 5  | 5  | 4  | 6  |

FIG. 11

−100mv @ R1, R2, R3 on-cell count at R1' = 3
on-cell count at R2' = 3 + 6 = 9
on-cell count at R3' = 3 + 6 + 4 = 13

| State | 11 | 10 | 00 | 01 |
|-------|----|----|----|----|
| Count | 3  | 6  | 4  | 7  |

−80mv @ R1, R2, R3 on-cell count at R1" = 5
on-cell count at R2" = 5 + 5 = 10
on-cell count at R3" = 5 + 5 + 4 = 14

| State | 11 | 10 | 00 | 01 |
|-------|----|----|----|----|
| Count | 5  | 5  | 4  | 6  |

FIG. 29

|  | E/W Count | Read Count | Operating Temperature |
|---|---|---|---|
| Region 1 | | | |
| Region 2 | | | |
| Region 3 | | | |
| ⋮ | | | |
| Region N | | | |

FIG. 30

|  | Defect 1 | Defect 2 | Defect 3 | Defect 4 |
|---|---|---|---|---|
| Region 1 | Possibility 1 | Possibility 2 | Possibility 3 | Possibility 4 |
| Region 2 | Possibility 2 | Possibility 1 | Possibility 3 | Possibility 4 |
| Region 3 | Possibility 3 | Possibility 4 | Possibility 1 | Possibility 2 |
| ⋮ | | | | |
| Region N | Possibility 4 | Possibility 3 | Possibility 2 | Possibility 1 |

MEMORY SYSTEM AND OPERATING METHOD THEREOF

CROSS-REFERENCE TO RELATED APPLICATION

This application is a continuation-in-part of U.S. patent application Ser. No. 15/961,210 filed on Apr. 24, 2018 which claims benefits of priority of Korean Patent Application No. 10-2017-0116943, filed on Sep. 13, 2017 and U.S. patent application Ser. No. 16/532,965 filed on Aug. 6, 2019 which is a continuation of U.S. patent application Ser. No. 15/813,502 filed on Nov. 15, 2017 and now issued as U.S. Pat. No. 10,379,955 on Aug. 13, 2019, which claims benefits of priority of Korean Patent Application No. 10-2017-0039915 filed on Mar. 29, 2017. The disclosure of each of the foregoing application is incorporated herein by reference in its entirety.

BACKGROUND

1. Field

Various embodiments of the present disclosure generally relate to a memory system and an operating method thereof.

2. Description of the Related Art

Recently, the paradigm of the computer environment is changed into a ubiquitous computing environment which allows users to get an access to a computer system anywhere anytime. For this reason, the use of portable electronic devices, such as mobile phones, digital cameras, laptop computers and the like, is surging. The portable electronic devices generally employ a memory system using a memory device for storing data. A memory system may be used as a main memory device or an auxiliary memory device of a portable electronic device.

A memory device has excellent stability and durability because it does not include a mechanical driving unit. Also, the memory device is advantageous in that it may access data quickly and consume a small amount of power. Non-limiting examples of a memory device having these advantages include a universal serial bus (USB) memory device, a memory card with diverse interfaces, and a solid-state drive (SSD).

The memory device may include a plurality of memory cells coupled to one word line, and each of the memory cells may be coupled to a page buffer through a bit line. A read operation may be performed, which senses and temporarily stores data stored in the memory cells, using such page buffers, and outputs the stored data.

A threshold voltage distribution of the memory cells may be further widened as time passes after a program operation is performed. As the threshold voltage distribution of the memory cells is widened, the reliability of the read operation may deteriorate. Thus, a technique for extracting a threshold voltage distribution of memory cells is needed.

SUMMARY

Embodiments provide a memory device with improved reliability and an operating method thereof.

According to an aspect of the present disclosure, there is provided a memory system including: a memory device configured to generate first read voltages and second read voltages, based on initial read voltages and first and second offset voltages, in response to a user read command, and output first data and second data, which are acquired by performing read operations on mufti-bit memory cells, based on the first read voltages and the second read voltages; and a memory controller configured to output the user read command, wherein the memory controller includes a state counter configured to count numbers of data bits respectively corresponding to a plurality of threshold voltage states from the first data and the second data, and extract numbers of memory cells respectively included in a plurality of threshold voltage regions divided by the first read voltages and the second read voltages by calculating the counted result.

According to an aspect of the present disclosure, there is provided a memory system including: a memory device; and a memory controller, wherein the memory device includes: multi-bit memory cells; an input/output circuit configured to receive a user read command from the memory controller; a voltage generating circuit configured to generate first read voltages, based on initial read voltages and a first offset voltage, and generate second read voltages, based on the initial read voltages and a second offset voltage, in response to the user read command; and a page buffer group configured to store first data acquired by performing a first MSB read operation and a first LSB read operation on the multi-bit memory cells, based on the first read voltages, and store second data acquired by performing a second MSB read operation and a second LSB read operation on the multi-bit memory cells, based on the second read voltages, wherein the memory controller includes a state counter configured to derive a first addition result by adding number of data bits respectively corresponding to a plurality of threshold voltage states from the first data, derive a second addition result by adding number of data bits respectively corresponding to a plurality of threshold voltage states from the second data, and extract a number of memory cells included in any one of a plurality of threshold voltage regions divided by the first read voltages and the second read voltages, based on a result obtained by subtracting the second addition result from the first addition result.

According to an aspect of the present disclosure, there is provided a method for operating a memory system, the method including: receiving a first user read command; reading first data through read operations on a plurality of memory cells, using first read voltages, in response to the user read command; receiving a second user read command and a first offset voltage; reading second data through the read operations on the plurality of memory cells, using second read voltages generated based on the first read voltages and the first offset voltage, in response to the second user read command; and extracting a number of memory cells included in a first region among a plurality of threshold voltage regions divided by the first read voltages and the second read voltages by subtracting a number of data bits corresponding a first threshold voltage state, which is extracted from the second data, from a number of data bits corresponding to the first threshold voltage state, which is extracted from the first data.

In an embodiment, a memory system may include: a memory device including a plurality of storage regions; and a controller. The controller may be coupled between a host and the memory device, and perform a read retry operation when a read error occurs in any one of the storage regions based on occurrence possibilities for a plurality of different type of defects in any one storage region where a read error occurred.

In an embodiment, a memory controller may include: a read retry table including a plurality of read retry sets; and a processor suitable for sorting a plurality of different type of defects based on occurrence possibilities for the respective defects in any one storage region among a plurality of storage regions included in a memory device, when a read error occurred in the any one storage region, selecting a read retry set among the plurality of read retry sets according to the sorted defect order, and performing a read retry operation using the selected read retry set.

In an embodiment, an operating method of a memory controller may include: sorting a plurality of different type of defects based on occurrence possibilities for the respective defects in any one storage region among a plurality of storage regions included in a memory device, when a read error occurred in the any one storage region; selecting a read retry set among a plurality of read retry sets included in a read retry table, according to the sorted defect order; and performing a read retry operation using the selected read retry set.

In an embodiment, a memory system may include a plurality of storage regions, each including a plurality of memory cells; and a controller configured to provide a plurality of read retry sets, determine an applying order of the plurality of read retry sets based on characteristics of a read error occurred in a first storage region among the plurality of storage regions, and apply at least one of the read retry sets, based on the applying order, for a read retry operation performed on the first storage region.

In an embodiment, a memory system may include a plurality of storage regions; and a controller configured to provide a plurality of read retry sets, determine an order of the read retry sets based on a cause of a read error which occurs on a first storage region among the plurality of storage regions, and perform a read retry operation on the first storage region based on the order.

In an embodiment, a memory system may include a plurality of storage regions; and a controller configured to provide a plurality of read retry sets, determine an order of the read retry sets based on occurrence possibilities of a read error which occurs on a first storage region among the plurality of storage regions, and perform a read retry operation on the first storage region based on the order.

In an embodiment, a memory system may include a plurality of storage regions; and a controller programmed to configure a read retry algorithm adaptively based on characteristics of read error which occurs on a first storage region among the plurality of storage regions, and to perform a read retry operation on the first storage region based on the adaptively configured read retry algorithm, wherein the characteristics of the read error relates to usage status of the first storage region.

In an embodiment, a memory system may include a plurality of storage regions, each including a plurality of memory cells; and a controller including predetermined read retry sets, programmed to invoke one having a higher priority among the read retry sets, the priority of the read retry sets being determined based on characteristics of a read error occurred in a first storage region among the plurality of storage regions, and apply the invoked read retry set for a read retry operation performed on the first storage region, wherein the characteristics of the read error relates to usage status of the first storage region.

In an embodiment, a memory system may include a plurality of storage regions; and a controller programmed to reconfigure a read retry algorithm based on a usage status of a first storage region, which a read error occurs in, among the storage region, and to perform a read retry operation on the first storage region based on the reconfigured read retry algorithm.

In an embodiment, a memory system may include a plurality of memory blocks, each including a plurality of cells, a controller configured to include a plurality of read retry sets, recognize on a read error from a first memory block among the plurality of memory blocks, and configure a read retry algorithm determining an applying order of the plurality of read retry sets based on a cause read error associated with the first memory block.

In an embodiment, a memory system may include a plurality of storage regions; and a controller programmed to configure an error reducing algorithm adaptively based on characteristics of a read error which occurs on a first storage region among the plurality of storage regions, and to perform a read retry operation on the first storage region based on the adaptively configured error reducing algorithm, wherein the characteristics of the read error relates to usage status of the first storage region.

In an embodiment, a memory system may include a plurality of storage regions; and a controller programmed to reconfigure an error reducing algorithm based on a usage status of a first storage region, which a read error occurs in, among the storage region, and to perform a read retry operation on the first storage region based on the reconfigured error reducing algorithm.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 9 to 12 are diagrams illustrating an operation of extracting a threshold voltage distribution according to an embodiment of the present disclosure.

FIG. 29 is a diagram illustrating an example in which status information is written to each storage region of a memory device by a status tracker in accordance with an embodiment.

FIG. 30 is a diagram illustrating an example in which read error occurrence possibilities for a plurality of different type of defects are decided in each storage region in accordance with an embodiment.

DETAILED DESCRIPTION

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

Figure 1:
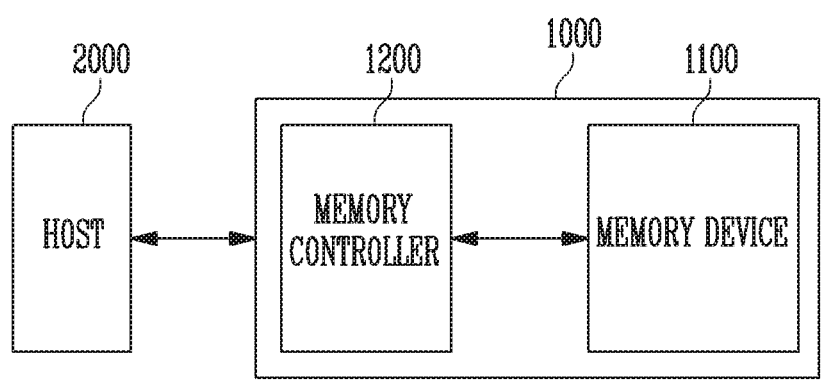
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a memory device 1100 that stores data and a memory controller 1200 that controls the memory device 1100 under the control of a host 2000.

The host 2000 may communicate with the memory system 1000 by using an interface protocol such as peripheral component interconnect-express (PCI-E), advanced technology attachment (ATA), serial ATA (SATA), parallel ATA (PATA), or serial attached SCSI (SAS). In addition, interface protocols between the host 2000 and the memory system 1000 are not limited to the above-described examples, and may be one of other interface protocols such as a universal serial bus (USB), a multi-media card (MMC), an enhanced small disk interface (ESDI), and integrated drive electronics (IDE).

The memory controller 1200 may control overall operations of the memory system 1000, and control data exchange between the host 2000 and the memory device 1100. For example, the memory controller 1200 may program or read data by controlling the memory device 1100 in response to a request of the host 2000. Also, the memory controller 1200 may store information main memory blocks and sub-memory blocks, which are included in the memory device 1100, and select the memory device 1100 such that perform a program operation on a main memory block or a sub-memory block according to the amount of data loaded for the program operation. In some embodiments, the memory device 1100 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory.

The memory device 1100 may perform a program, read, or erase operation under the control of the memory controller 1200.

Figure 2:
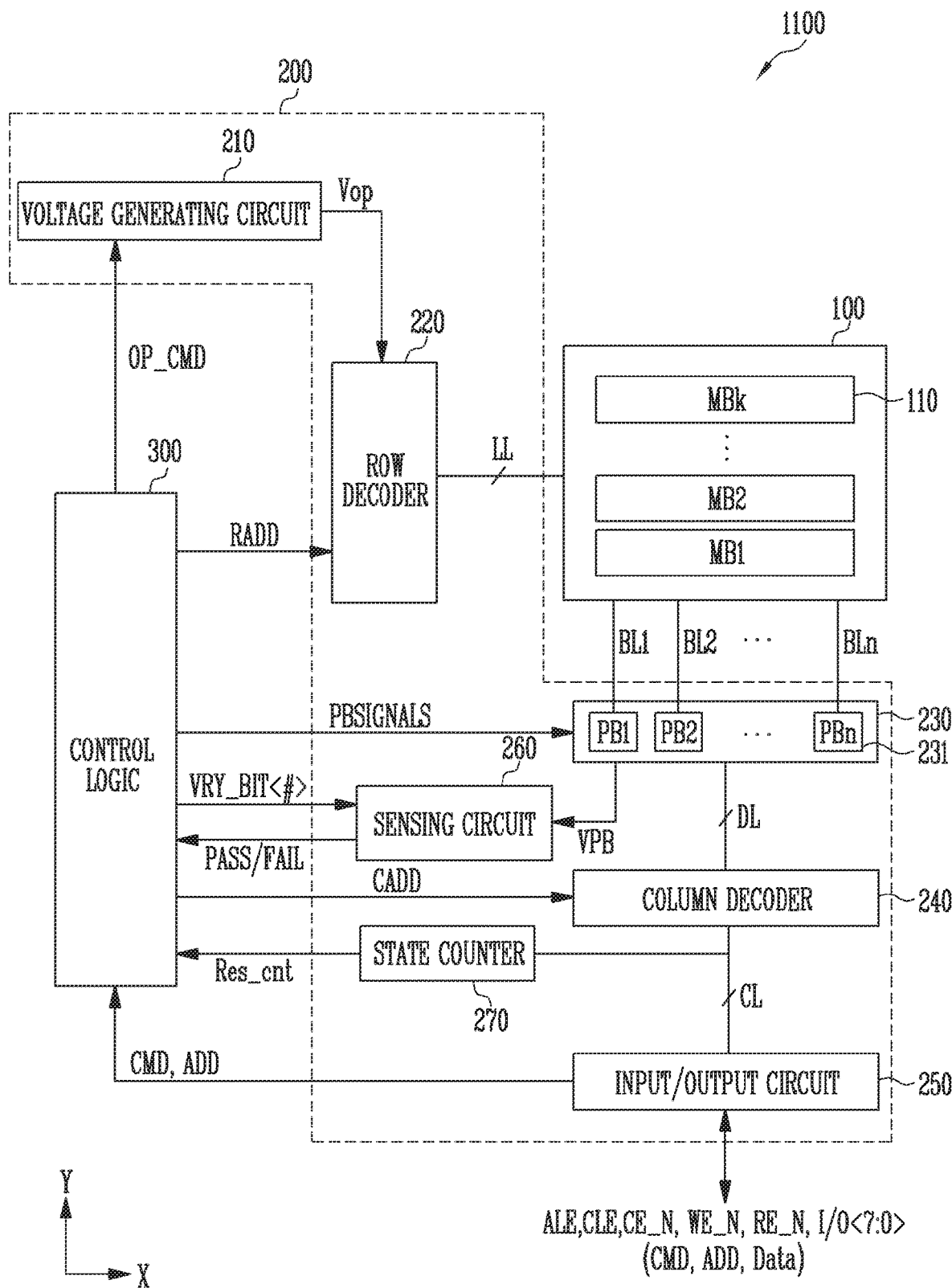
FIG. 2 is a diagram illustrating a memory device of FIG. 1.

FIG. 2 is a diagram illustrating the memory device 1110 of FIG. 1.

Referring to FIG. 2, the memory device 1110 may include a memory cell array 100 that stores data. The memory device 1110 may include peripheral circuits 200 that may perform a program operation for storing data in the memory cell array 100, a read operation for outputting the stored data, and an erase operation for erasing the stored data. The memory device 1110 may include a control logic 300 that controls the peripheral circuits 200 under the control of the memory controller (1200 of FIG. 1).

The memory cell array 100 may include a plurality of memory blocks MB1 to MBk 110 (k is a positive integer). Local lines LL and bit lines BL1 to BLn (n is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk may be implemented as a two-dimensional (2D) or a three-dimensional (3D) structure. For example, the memory cells in the memory blocks 110 having a 2D structure may be arranged horizontally on a substrate. For example, memory cells in the memory blocks 110 having a 3D structure may be stacked vertically on the substrate.

The peripheral circuits 200 may perform program, read, and erase operations of a selected memory block 110 under the control of the control logic 300. For example, the peripheral circuits 200, under the control of the control logic 300, may supply verify and pass voltages to the first select line, the second select line, and the word lines, selectively discharge the first select line, the second select line, and the word lines, and verify memory cells coupled a selected word line among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn.

The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

The input/output circuit 250 may transfer a command CMD and address ADD, which are received from the memory controller, to the control logic 300, or exchange data Data with the column decoder 240. The input/output circuit 250 may transmit data Data transferred from the outside through input/output pins I/O<7:0> to the column decoder 240 through the column lines CL. Also, the input/output circuit 250 may output data output from the column decoder 240 to be transmitted through the column lines CL to an external device through the input/output pins I/O<7:0>. At this time, the output data may be output in synchronization with a read enable clock signal RE_N. Alternatively, the memory device 1100 may output a data strobe signal DQS (not shown). In this case, the output data may be output in synchronization with the data strobe signal DQS.

The input/output circuit 250 may receive a command CMD from the external device and transfer the command CMD to the control logic 300 in a section in which a command latch enable signal CLE is activated. The input/output circuit 250 may receive an address ADD from the external device and transfer the address ADD to the control logic 300 in a section in which an address latch enable signal ALE is activated. The command CMD or the address ADD may be input in synchronization with a write enable signal WE_N input from the external device. In addition, the memory device 1100 may receive an address and a command in a section in which a chip enable signal CE_N is activated.

The memory device 1100 may include a state counter 270. The state counter 270 may generate a count result Res_cnt by counting a number of memory cells included in each a plurality of threshold voltage sections, based on data output from the page buffer group 230. Also, the state counter 270 may provide the count result Res_cnt to the control logic 300. This will be described in detail below.

Figure 3:
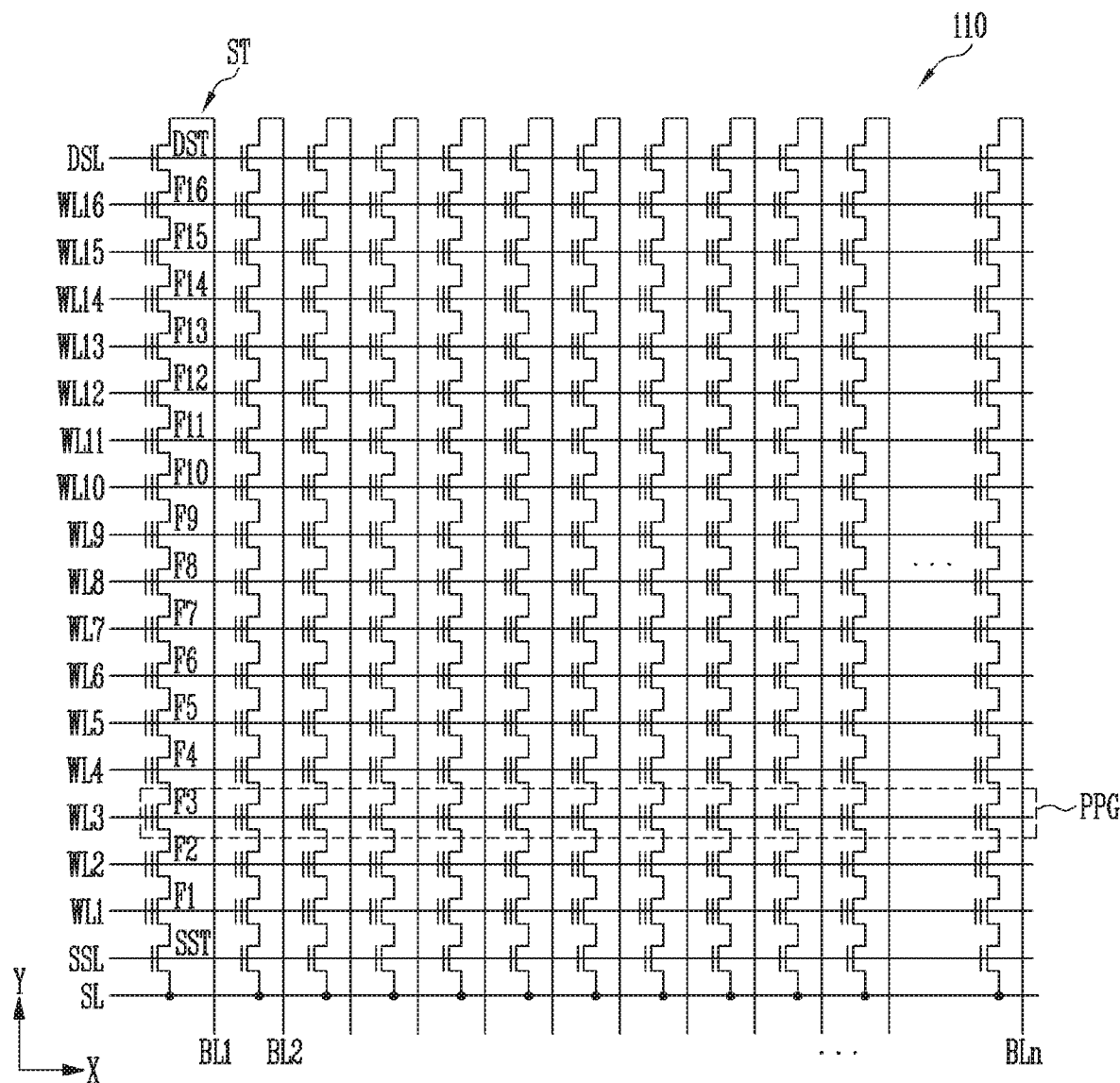
FIG. 3 is a diagram illustrating a memory block of FIG. 2.

FIG. 3 is a diagram illustrating the memory block of FIG. 2.

Referring to FIG. 3, a plurality of word lines arranged in parallel to one another between a first select line and a second select line may be coupled to the first memory block 110. Here, the first select line may be a source select line SSL, and the second select line may be a drain select line DSL. More specifically, the first memory block 110 may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and memory cells of which number is larger than that of the memory cells F1 to F16 shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG. Therefore, physical pages PPG of which number corresponds to that of the word lines WL1 to WL16 may be included in the first memory block 110.

Each memory cell among plurality of memory cells F1 to F16 may store one bit of data. This is generally called as a single level cell (SLC). In this case, one physical page PPG may store one logical page (LPG) data. The one LPG data may include data bits of which number corresponds to that of cells included in one physical page PPG. In addition, each memory cell among plurality of memory cells F1 to F16 may store two or more bits of data. This is generally called as a multi-level cell. In this case, one physical page PPG may store two or more LPG data.

Figure 4:
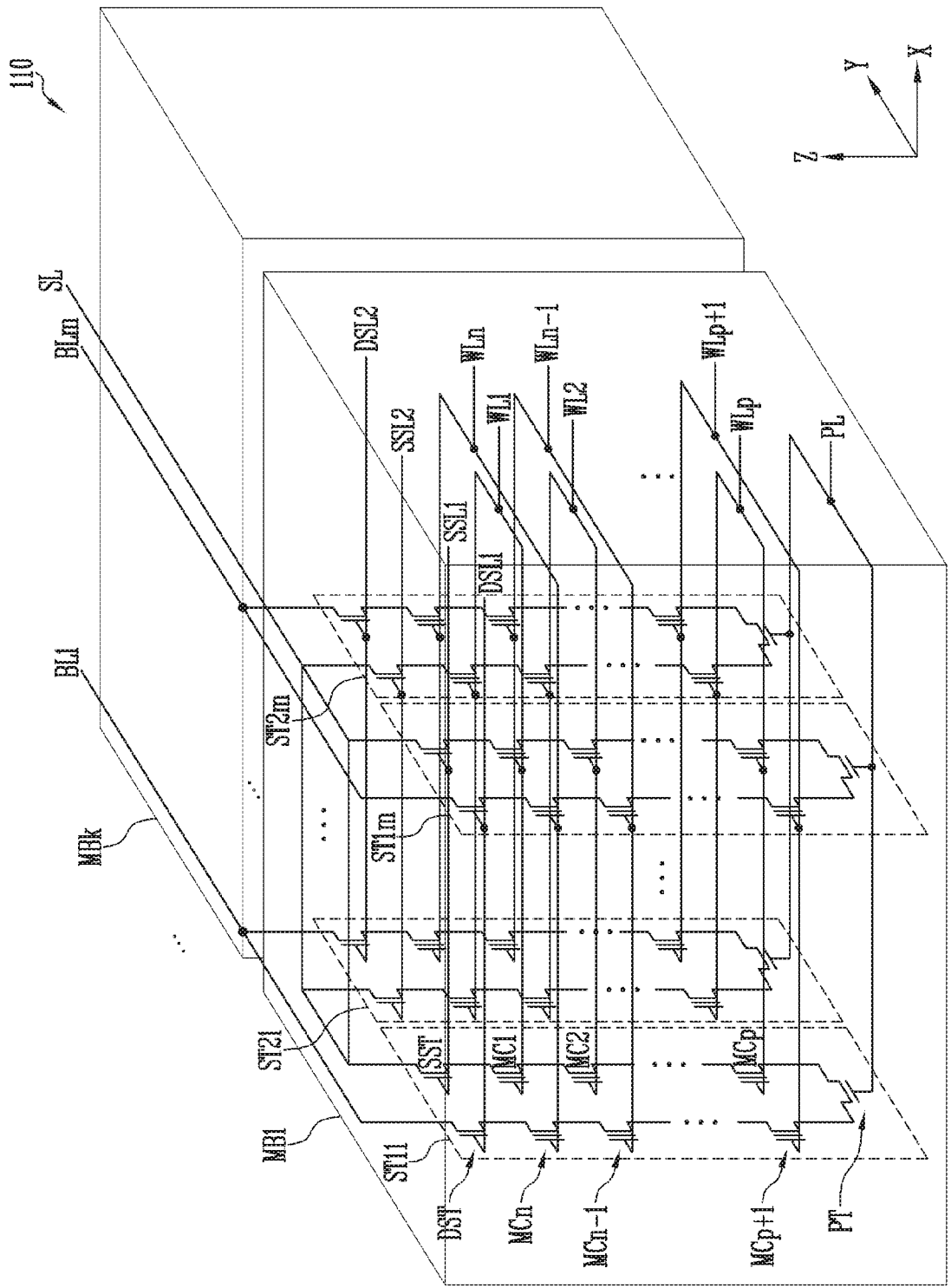
FIG. 4 is a diagram illustrating a three-dimensional (3D) configuration of a memory block.

FIG. 4 is a diagram illustrating a three-dimensional (3D) configuration of a memory block shown in FIG. 2.

Referring to FIG. 4, the memory cell array 100 may include a plurality of memory blocks MB1 to MBk 110. The memory block 110 may include a plurality of strings ST11 to ST1*m* and ST21 to ST2*m*. In an embodiment, each of the plurality of strings ST11 to ST1*m* and ST21 to ST2*m* may be formed in a 'U' shape. In the memory block 110, m strings may be arranged in a row direction (X direction). Although in FIG. 4 it is illustrated that two strings are arranged in a column direction (Y direction), the present disclosure is not limited thereto. That is, three or more strings may be arranged in the column direction (Y direction).

Each of the plurality of strings ST11 to ST1*m* and ST21 to ST2*m* may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, source select transistors of strings ST11 to S1*m* of a first row may be coupled to a first source select line SSL1. Source select transistors of strings ST21 to ST2*m* of a second row may be coupled to a second source select line SSL2.

In an embodiment, the source select transistors of the strings ST11 to ST1*m* and ST21 to ST2*m* may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1, of the first row may be coupled to a first drain select line DSL1. Drain select transistors of the strings ST21 to ST2*m* of the second row may be coupled to a second drain select line DSL2.

Strings arranged in the column direction may be coupled to bit lines extending in the column direction. In FIG. 4, strings ST11 and ST21 of a first column may be coupled to a first bit line BL1. Strings ST1*m* and ST2*m* of an mth column may be coupled to an nth bit line BLn.

Memory cells coupled to the same word line among the strings arranged in the row direction may constitute one page. For example, memory cells coupled to the first word line WL1 among the strings ST11 to ST1*m* of the first row may constitute one page. Memory cells coupled to the first word line WL1 among the strings ST21 to ST2*m* of the second row may constitute another page. As any one of the drain select lines DSL1 and DSL2 is selected, strings arranged in one row direction may be selected. As any one of the word lines WL1 to WLn is selected, one page among the selected strings may be selected.

Figure 5:
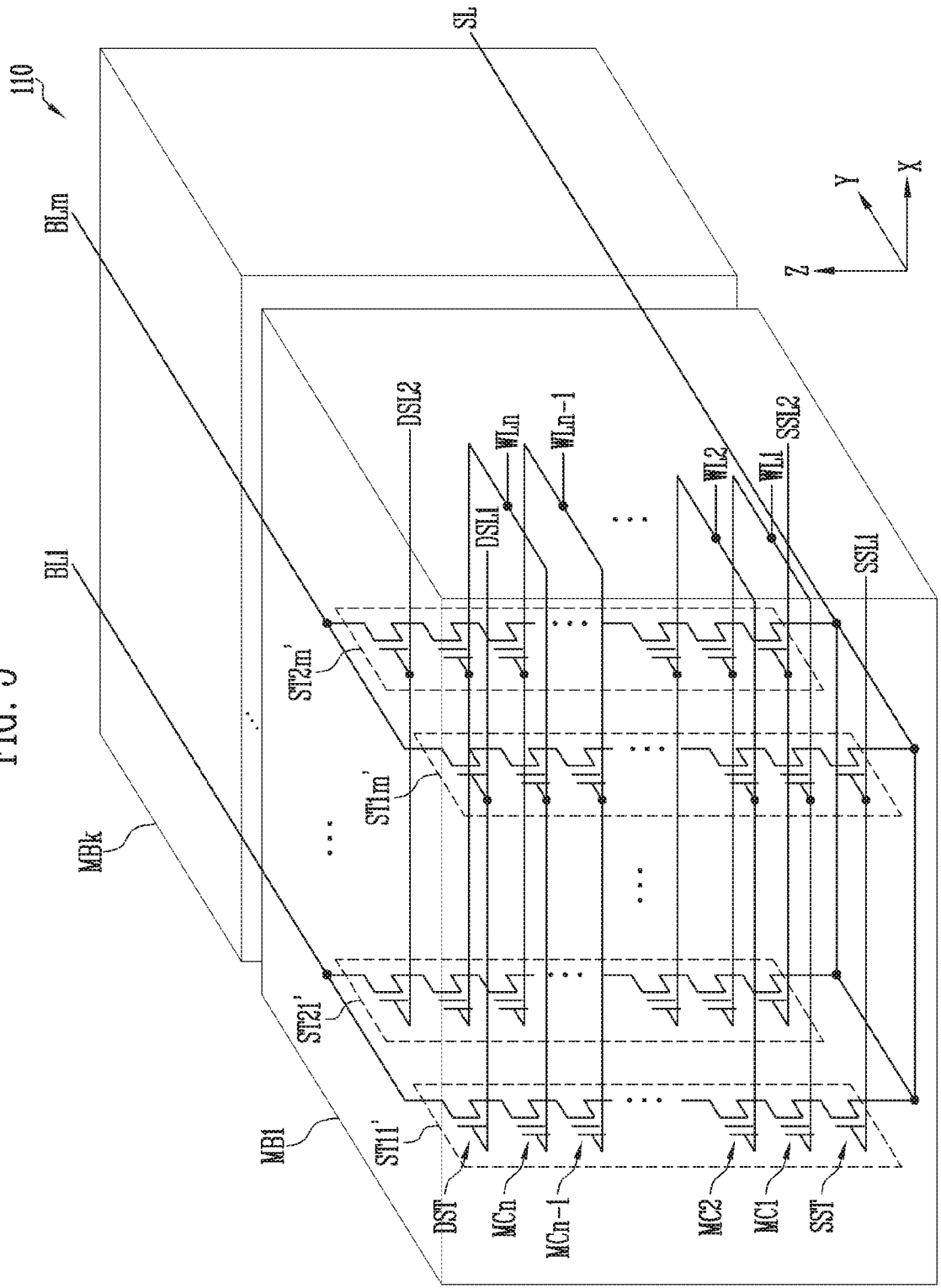
FIG. 5 is a diagram illustrating a three-dimensional (3D) configuration of a memory block.

FIG. 5 is a diagram illustrating a three-dimensional configuration of the memory block shown in FIG. 2.

Referring to FIG. 5, the memory cell array 100 may include a plurality of memory blocks MB1 to MBk 110. The memory block 110 may include a plurality of strings ST11' to ST1m' and ST21' to ST2m'. Each of the plurality of strings ST11' to ST1m' and ST21' to ST2m' may extend along a vertical direction (Z direction), In the memory block 110, strings may be arranged in a row direction (X direction). Although in FIG. 5 it is illustrated that two strings are arranged in a column direction (Y direction), the present disclosure is not limited thereto. That is, three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled to between a source line SL and the memory cells MC1 to MCn. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line SSL2. In an embodiment, the source select transistors of the strings ST11' to ST1m' and ST21' to ST2m' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 110 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

That is, the memory block 110 of FIG. 5 may have a substantially similar circuit to that of the memory block 110 of FIG. 4, except that the pipe transistor PT may be excluded from each string in the memory block 110 of FIG. 5.

Figure 6:
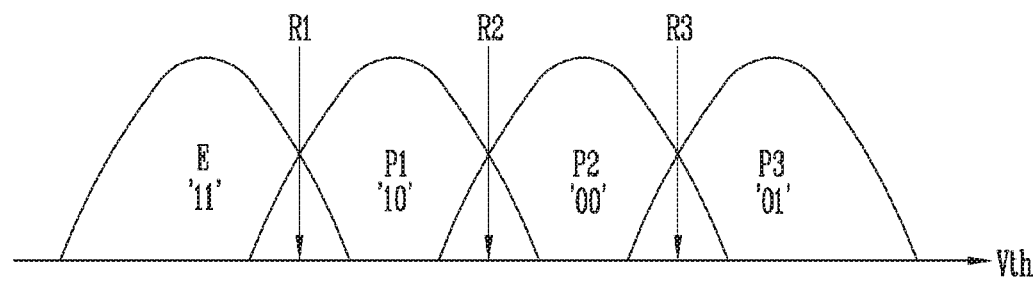
FIG. 6 is a diagram illustrating a read operation according to an embodiment of the present disclosure.

FIG. 6 is a diagram illustrating a read operation according to an embodiment of the present disclosure.

Referring to FIG. 6, each memory cell may store data of 2 bits, for example. The memory cells included in one physical page PPG may form an erase threshold voltage distribution E, a first program threshold voltage distribution P1, a second program threshold voltage distribution P2, and a third program threshold voltage distribution P3 as shown in FIG. 6. In an embodiment, when one memory cell stores 3 bits of data, memory cells included in one physical page PPG may form one erase threshold voltage distribution and seven program threshold voltage distributions.

As time passes after memory cells are programmed, threshold voltages of the memory cells may be lower or higher than those of the memory cells just after the memory cells are programmed. Therefore, a threshold voltage distribution formed after time has passed may be further widened than that formed just after the memory cells are programmed. As a result, portions of adjacent threshold voltage distributions may overlap with each other as shown in FIG. 6. When the threshold voltage distribution is excessively widened, a read operation may fail. In other words, when the threshold voltage is widened, a plurality of error bits may be included in data read from a memory cell in the read operation. When the number of error bit becomes a certain level or more, an error correction operation may fail. The failure of the error correction operation in the read operation may degrade the reliability of the memory system 1000. Therefore, an operation of extracting information on threshold voltage distributions of memory cells may be required to prevent the degradation of the reliability.

When a memory cell stores data of 2 bits, the data of 2 bits may be read by an operation of reading the least significant bit (LSB), i.e., an LSB read operation and an operation of reading the most significant bit (MSB), i.e. an MSB read operation. In an embodiment, the LSB read operation may be performed by a one-time read operation, using a second read voltage R2. In addition, the MSB read operation may be performed by a two-time read operation, using a first read voltage R1 and a third read voltage R3. 2 bits may be extracted from each memory cell by the LSB read operation and the MSB read operation. As a result, memory cells of which threshold voltages are lower than the first read voltage R1 may have a threshold voltage state corresponding to a binary bit-value '11,' and memory cells having threshold voltages between the first read voltage R1 and the second read voltage R2 may have a threshold voltage state corresponding to a binary bit-value '10.' In addition, memory cells having threshold voltages between the second read voltage R2 and the third read voltage R3 may have a threshold voltage state corresponding to a binary bit-value '00,' and memory cells of which threshold voltages are higher than the third read voltage R3 may have a threshold voltage state corresponding to a binary bit-value '01.'

The state counter 270 according to an embodiment may count a number of data bits corresponding to each threshold voltage state from the data read by the LSB read operation and the MSB read operation, and extract a number of memory cells included in each threshold voltage state, based on the counted number of data bits. In other words, the state counter 270 may count a number of memory cells having the threshold voltage state corresponding to a binary bit-value '11,' a number of memory cells having the threshold voltage state corresponding to a binary bit-value '10,' a number of memory cells having the threshold voltage state corresponding to a binary bit-value '00,' and a number of memory cells having the threshold voltage state corresponding to a binary bit-value '01' from data read by the LSB read operation and the MSB read operation, which are performed using the first read voltage R1, the second read voltage R2, and the third read voltage R3.

Figure 7:
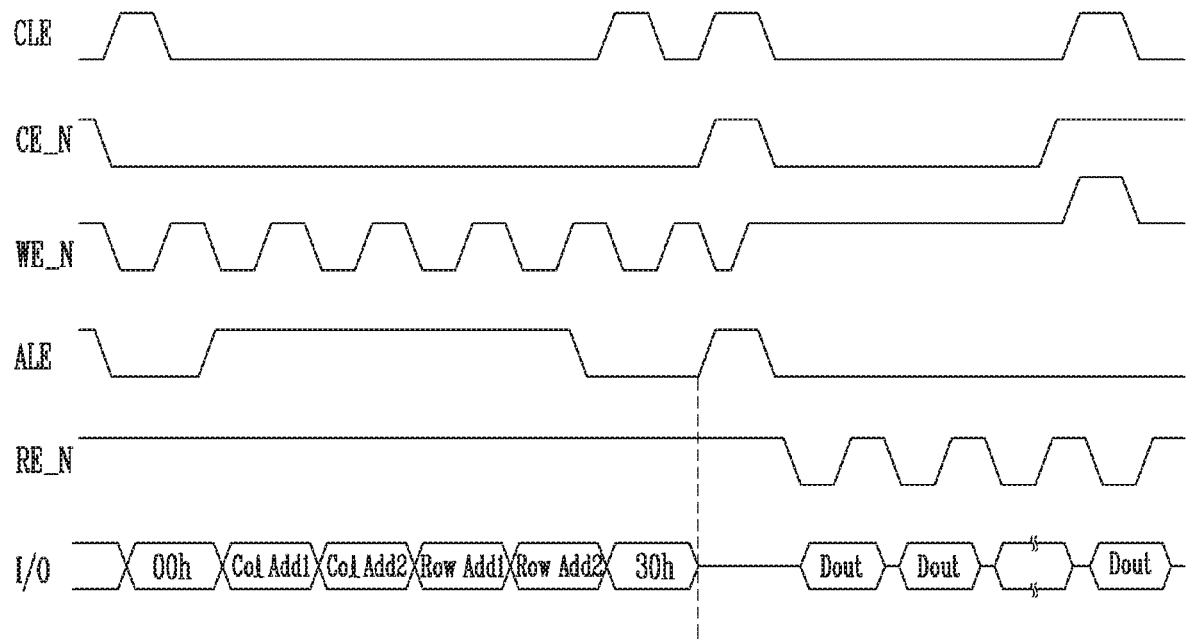
FIG. 7 is a diagram illustrating a sequence of a user read command according to an embodiment of the present disclosure.

FIG. 7 is a diagram illustrating a sequence of a user read command according to an embodiment of the present disclosure.

Referring to FIG. 7, the memory device 1100 may receive a user read command and a read address to perform an LSB read operation or an MSB read operation. The LSB read operation and the MSB read operation may be distinguished from each other by the read address under the same read command.

The memory device 1100 may receive a user read command and a read address through the input/output pins I/O<7:0> while the chip enable signal CE_N is being activated. In general, the chip enable signal CE_N may have a value corresponding to logic low when it is activated.

The memory device 1100 may receive a preamble of the user read command while the chip enable signal CE_N and the latch enable signal CLE are being activated. In general, the preamble of the user read command may be configured as '00h.'

The memory device 1100 receives the preamble of the user read command, i.e., '00h,' and may receive the read address after the command latch enable signal CLE is deactivated. The read address may be input to the memory device 1100 in a section in which the address latch enable signal ALE is activated. In an embodiment, the read address may be input during four cycles. A first column address Col Add1 and a second column address Col Add2 may be input to the memory device 1100 during the first two cycles. Then, a first row address Row Add1 and a second row address Row Add2 may be input to the memory device 1100 during the other two cycles.

The address enable signal ALE may be deactivated after the read address is input. The command latch enable signal CLE may be again activated after the address enable signal ALE is deactivated and the memory device 1100 may receive a postamble of the user read command while the command latch enable signal CLE is being activated. In general, the postamble of the user read command may be configured as '30h.' A process in which the preamble of the user read command, the read address, and the postamble of the user read command are input to the memory device 1100 may be designated as a user read command sequence. In other words, the user read command sequence may mean the entire process in which the read command and the read address are input to the memory device 1100. In addition, the postamble of the user read command, i.e., '30h' may be designated as a confirm command. If the confirm command is input to the memory device 1100, the memory device 1100 may start a read operation of reading data from memory cells.

The command latch enable signal CLE may be deactivated after the postamble of the user read command, i.e., '30h' is input. Then, the memory device 1100 may internally perform a read operation of reading data stored in memory cells. The user read command and the read address may be input to the memory device 1100 through the input/output circuit 250 of FIG. 2.

When the read address indicates an LSB page, the page buffer group 230 of the memory device 1100 may perform the read operation, using the second read voltage R2 of FIG. 6. In addition, when the read address indicates an MSB page, the page buffer group 230 of the memory device 1100 may perform the read operation, using the first read voltage R1 and the third read voltage R3 of FIG. 6. In other words, in the MSB read operation, the memory device 1100 may extract 1 bit from each memory cell, using a plurality of read voltages.

The read command or the read address may be input to the memory device 1100 in synchronization with the write enable signal WE_N. In other words, the write enable signal WE_N may toggle while the read command or the read address is being input.

The page buffer group 230 may store data read from the memory cell in response to the read address and the read command. Subsequently, the data stored in the page buffer group 230 may be output to the outside through the input/output pins I/O<7:0> as denoted with "bout" in FIG. 7.

The above-described read command, i.e., the read command configured with the preamble of '00h' and the postamble of '30h' may be a command sequence that is published to users. The read command may be referred to as a user read command. Unlike the user read command, data stored in each memory cell may be read in response to a test read command so as to test the memory device 1100. In general, the test read command is not published to users but may be controlled by only a manufacturer.

Figure 8:
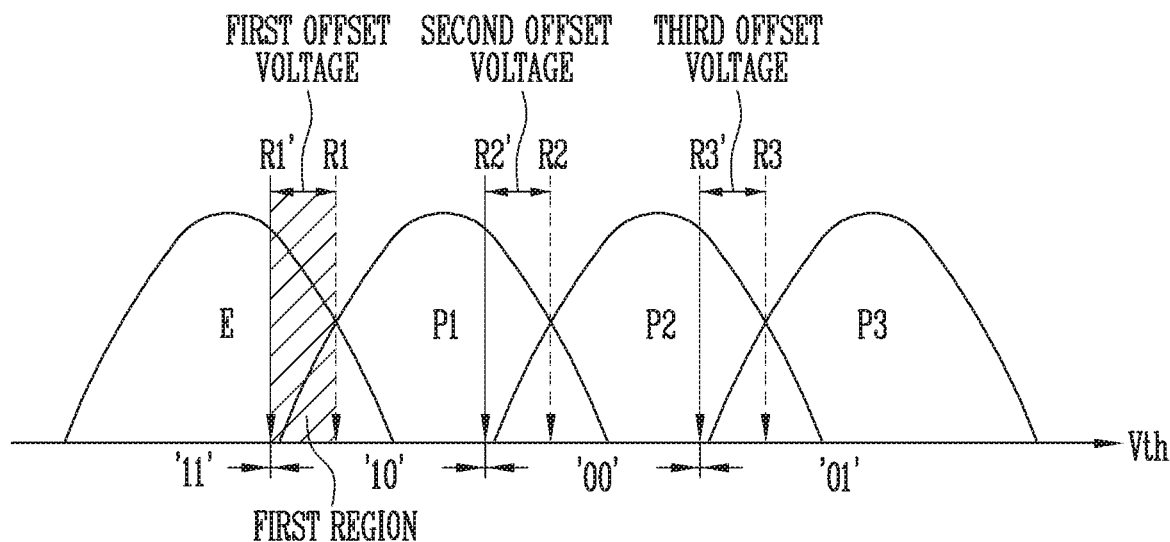
FIG. 8 is a diagram illustrating a read operation according to an embodiment of the present disclosure.

FIG. 8 is a diagram illustrating a read operation according to an embodiment of the present disclosure.

Referring to FIG. 8, the LSB read operation or the MSB read operation may be performed by varying a read voltage. In other words, a second read voltage RT obtained as the second read voltage R2 is changed by a second offset voltage may be used rather than the second read voltage set to an initial value in the LSB read operation. In addition, a first read voltage R1' obtained as the first read voltage R1 is changed by a first offset voltage and a third read voltage R3' obtained as the third read voltage R3 is changed by a third offset voltage may be used rather than the first read voltage R1 and the third read voltage R3, which are set to initial values in the MSB read operation. The first to third offset voltages may be equal to or different from one another. Also, the first to third offset voltages may be input from the external device through the input/output circuit 250. In this case, the first to third offset voltages may be input in the form of digital code values from the external device through the input/output circuit 250.

When the LSB read operation and the MSB read operation are performed using the first to third read voltages R1', R2', and R3' changed by the first to third offset voltages, memory cells of threshold voltages are lower than the first read voltage R1' varied based on the first offset voltage may have a threshold voltage state corresponding to a binary bit-value '11.' In addition, memory cells having threshold voltages between the first read voltage R1' varied based on the first offset voltage and the second read voltage R2' varied based on the second offset voltage may have a threshold voltage state corresponding to a binary bit-value '10.' In addition, memory cells having threshold voltages between the second read voltage R2' varied based on the second offset voltage and the third read voltage R3' varied based on the third offset voltage may have a threshold voltage state corresponding to a binary bit-value '00.' Finally, memory cells of threshold voltages are higher than the third read voltage R3' varied based on the third offset voltage may have a threshold voltage state corresponding to a binary bit-value '01.'

In an embodiment, the memory cells that have the threshold voltage state corresponding to a binary bit-value '11' through the LSB read operation and the MSB read operation, which are performed based on the first to third read voltages R1, R2, and R3, and have the threshold voltage state corresponding to a binary bit-value '10' through the LSB read operation and the MSB read operation, which are performed based on the first to third read voltages R1', R2', and R3' varied through the first to third offset voltages refer to memory cells included in a first region. In other words, the number of memory cells included in the first region may be extracted by subtracting the number of memory cells that have threshold voltage state corresponding to a binary bit-value '10' through the LSB read operation and the MSB read operation, which are performed based on the first to third read voltages R1', R2', and R3' varied through the first to third offset voltages from the number of memory cells that have the threshold voltage state corresponding to a binary bit-value '11' through the LSB read operation and the MSB read operation, which are performed based on the first to third read voltages R1, R2, and R3.

As described in FIG. 6, the threshold voltage distribution of memory cells may be widened or moved as time passes after a program operation is performed. As a result, a read operation may be performed using a read voltage changed as an offset is provided to a read voltage set as an initial value in order to reliably read data from the memory cells having the distorted threshold voltage distribution.

An offset voltage may be input to the memory device 1100 before the user read command is applied. In an embodiment, in the LSB read operation, the memory device 1100 may first receive an offset voltage and then receive the user read command and the read address. The memory device 1100 may perform the read operation, using a new read voltage that is adjusted by the offset voltage input to the read voltage R2 set to the initial value in response to the user read command and the read address. In an embodiment, an offset voltage may be input after the read address and the user read command are applied. Also, the offset voltage may be input during the read command sequence. In an embodiment, the offset voltage may be input before the read address is input after the preamble of the user read command of the read command sequence is input. The MSB read operation may also be performed by receiving one offset voltage. In this case, the same offset voltage may be applied to the first read voltage R1 and the third read voltage R3.

In an example, two offset voltages, i.e., the first offset voltage and the second offset voltage may be input before the user read command is applied. In an embodiment, the MSB read operation may be performed using two or more read voltages. In this case, the memory device 1100 may receive a plurality of offset voltages such that the offset voltages are differently applied to a plurality of read voltages, respectively. For example, the memory device 1100 may perform the read operation, using a new read voltage obtained as the first read voltage R1 of FIG. 8 is adjusted by the first offset voltage and a new read voltage obtained as the third read voltage R3 of FIG. 8 is adjusted by the second offset voltage.

FIGS. 9 to 12 are diagrams illustrating an operation of extracting a threshold voltage distribution according to an embodiment of the present disclosure.

Figure 9:
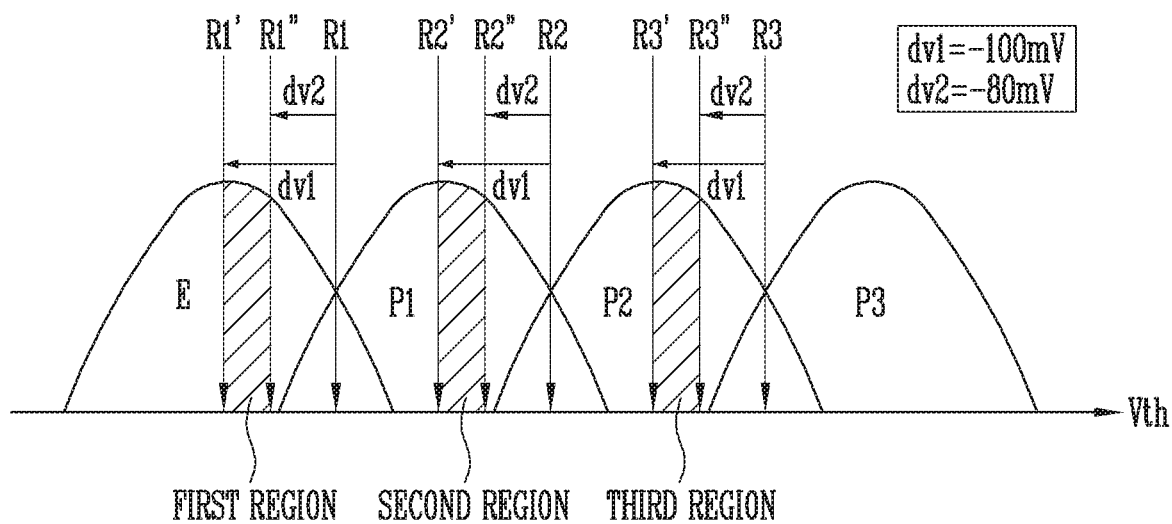

Referring to FIGS. 9 and 10, the memory device 1100 may perform a read operation plurality of times by varying read voltages. First, the LSB read operation and the MSB read operation may be performed using new first to third read voltages R2', and R3' obtained as the first to third read voltages R1, R2, and R3 are varied by a first offset voltage dV1. This LSB and MSB read operation with the first to third read voltages RV, R2', and R3' is referred to as a first loop Loop 1 in this example. In an embodiment, the first offset voltage dV1 may be 400 mV. Then, the LSB read operation and the MSB read operation may be performed using new first to third read voltages R1", R2", and R3" obtained as the first to third read voltages R1, R2, and R3 are varied by a second offset voltage dV2. This LSB and MSB read operation with the first to third read voltages R1", R2", and R3" is referred to as a second loop Loop 2 in this example. In an embodiment, the second offset voltage dV2 may be −80 mV.

The memory device 1100 may count a number of data bits corresponding to a binary bit-value '11,' a number of data bits corresponding to a binary bit-value '10,' a number of data bits corresponding to a binary bit-value '00,' and a number of data bits corresponding to a binary bit-value '01' from data read through the first loop Loop 1, i.e., through the LSB read operation and the MSB read operation, using the first offset voltage dV1. In an embodiment, a binary bit-value '10' may be a case where the result of the LSB read operation is determined as a binary bit-value i.e., an on-cell in a read operation using the second read voltage R2', and the result of the MSB read operation is determined as a binary bit-value '0,' i.e., an off-cell in a read operation using the first read voltage R1'. In an embodiment, a binary bit-value '10' may be a case where the result of the MSB read operation is determined as a binary bit-value '1' and the result of the LSB read operation is determined as a binary bit-value '0.' FIG. 10 illustrates a case where, from data read through the first loop Loop1, the number of data bits corresponding to a binary bit-value '11' is 3, the number of data bits corresponding to a binary bit-value '10' is 6, the number of data bits corresponding to a binary bit-value '00' is 4, and the number of data bits corresponding to a binary bit-value '01' is 7.

The memory device 1100 may count a number of data bits corresponding to a binary bit-value '11,' a number of data bits corresponding to a binary bit-value '10,' a number of data bits corresponding to a binary bit-value '00,' and a number of data bits corresponding to a binary bit-value '01' from data read through the second loop Loop 2, i.e., through the LSB read operation and the MSB read operation, using the second offset voltage dV2. FIG. 10 illustrates a case where, from data read through the second loop Loop 2, the number of data bits corresponding to a binary bit-value '11' is 5, the number of data bits corresponding to a binary bit-value '10' is 5, the number of data bits corresponding to a binary bit-value '00' is 4, and the number of data bits corresponding to a binary bit-value '01' is 6.

When comparing the result obtained through the first loop Loop 1 with the result obtained through the second loop Loop 2, the number of data bits corresponding to a binary bit-value '11' is 3 in the first loop Loop 1, and the number of data bits corresponding to a binary bit-value '11' is 5 in the second loop Loop 2. 2 is derived by subtracting 3 from 5. This means that the number of memory cells included in a first region of FIG. 9 is 2. In other words, the first region is a region in which memory cells determined as off-cells in the first loop Loop 1 using the first read voltage R1' adjusted by the first offset voltage dV1 and memory cells determined as on-cells in the second loop Loop 2 using the first read voltage R1" adjusted by the second offset voltage dV2 are located. As exemplified in FIG. 10, a number of memory cells located in the first region corresponds to difference in the number of memory cells determined as corresponding to a binary bit-value '10' in the first loop Loop 1 and determined as corresponding to a binary bit-value '11' in the second loop Loop 2. In this manner, the number of memory cells included in the first region can be counted.

When comparing the result obtained through the first loop Loop 1 with the result obtained through the second loop Loop 2, the number of data bits corresponding to a binary bit-value '10' is 6 in the first loop Loop 1, and the number of data bits corresponding to a binary bit-value '10' is 5 in the second loop Loop 2. That is, 9 is derived by adding the number of data bits corresponding to a binary bit-value '11' and a binary bit-value '10' in the first loop Loop 1, and 10 is derived by adding the number of data bits corresponding to a binary bit-value '11' and a binary bit-value '10' in the second loop Loop 2. 1 is derived by subtracting 9 from 10. This means that the number of memory cells included in a second region of FIG. 9 is 1. In other words, the second region is a region in which memory cells determined as off-cells in the first loop Loop 1 using the second read voltage R2' adjusted by the first offset voltage dV1 and memory cells determined as on-cells in the second loop Loop 2 using the second read voltage R2" adjusted by the second offset voltage dV2 are located. As exemplified in FIG. 10, a number of memory cells located in the second region corresponds to difference in the number of memory cells determined as corresponding to a binary bit-value '00' in the first loop Loop 1 and determined as corresponding to a binary bit-value '10' in the second loop Loop 2. In this manner, the number of memory cells included in the second region can be counted.

When comparing the result obtained through the first loop Loop 1 with the result obtained through the second loop Loop 2, the number of data bits corresponding to a binary bit-value '00' is 4 in the first loop Loop 1, and the number of data bits corresponding to a binary bit-value '00' is 4 in the second loop Loop 2. That is, 13 is derived by adding the number of data bits corresponding to a binary bit-value '11,' a binary bit-value '10,' and a binary bit-value '00' in the first loop Loop 1, and 14 is derived by adding the number of data bits corresponding to a binary bit-value '11,' a binary bit-value '10,' and a binary bit-value '00' in the second loop Loop 2. 1 is derived by subtracting 13 from 14. This means that the number of memory cells included in a third region of FIG. 9 is 1. In other words, the third region is a region in which memory cells determined as off-cells in the first loop Loop 1 using the third read voltage R3' adjusted by the first offset voltage dV1 and memory cells determined as on-cells in the second loop Loop 2 using the third read voltage R3" adjusted by the second offset voltage dV2 are located. As exemplified in FIG. 10, a number of memory cells located in the third region corresponds to difference in the number of memory cells determined as corresponding to a binary bit-value '01' in the first loop Loop 1 and determined as corresponding to a binary bit-value '00' in the second loop Loop 2. In this manner, the number of memory cells included in the third region can be counted.

Referring to FIG. 11, the number of data bits corresponding to a binary bit-value '11' is 3 in the first loop Loop 1, and the number of data bits corresponding to a binary bit-value '11' is 5 in the second loop Loop 2. That is, a value obtained by subtracting the number of data bits corresponding to a binary bit-value '11' in the first loop Loop 1 from the number of data bits corresponding to a binary bit-value '11' in the second loop Loop 2 means the number of memory cells included in the first region. In other words, the number of memory cells determined as on-cells in the read operation using the first read voltage R1' in the first loop Loop 1 is the number of data bits corresponding to a binary bit-value '11' in the first loop Loop 1, and the number of memory cells determined as on-cells in the read operation using the first read voltage R1" in the second loop Loop 2 is the number of data bits corresponding to a binary bit-value '11' in the second loop Loop 2. That is, the number of memory cells included in the first region can be extracted by subtracting the number of data bits corresponding to a binary bit-value '11' in the first loop Loop 1 from the number of data bits corresponding to a binary bit-value '11' in the second loop Loop 2. The counting operation and the subtracting and adding operations, which are described above, may be performed by the state counter 270 of FIG. 2.

The number of data bits corresponding to a binary bit-value '11' and a binary bit-value '10' is 9 in the first loop Loop 1, and the number of data bits corresponding to a binary bit-value '11' and a binary bit-value '10' is 10 in the second loop Loop 2. That is, a value obtained by subtracting the number of data bits corresponding to a binary bit-value '11' and a binary bit-value '10' in the first loop Loop 1 from the number of data bits corresponding to a binary bit-value '11' and a binary bit-value '10' in the second loop Loop 2 means the number of memory cells included in the second region. In other words, the number of memory cells determined as on-cells in the read operation using the second read voltage R2' adjusted by the first offset voltage dV1 in the first loop Loop 1 is the number of data bits corresponding to a binary bit-value '11' and a binary bit-value '10' in the first loop Loop 1, and the number of memory cells determined as on-cells in the read operation using the second read voltage R2" adjusted by the second offset voltage dV2 in the second loop Loop 2 is the number of data bits corresponding to a binary bit-value '11' and a binary bit-value '10' in the second loop Loop 2. That is, the number of memory cells included in the second region can be extracted by subtracting the number of data bits corresponding to a binary bit-value '11' and a binary bit-value '10' in the first loop Loop 1 from the number of data bits corresponding to a binary bit-value '11' and a binary bit-value '10' in the second loop Loop 2. The counting operation and the subtracting and adding operations, which are described above, may be performed by the state counter 270 of FIG. 2.

The number of data bits corresponding to a binary bit-value '11,' a binary bit-value '10,' and a binary bit-value '00' is 13 in the first loop Loop 1, and the number of data bits corresponding to a binary bit-value '11,' a binary bit-value '10,' and a binary bit-value '00' is 14 in the second loop Loop 2. That is, a value obtained by subtracting the number of data bits corresponding to a binary bit-value '11,' a binary bit-value '10,' and a binary bit-value '00' in the first loop Loop 1 from the number of data bits corresponding to a binary bit-value '11,' a binary bit-value '10,' and a binary bit-value '00' in the second loop Loop 2 means the number of memory cells included in the third region. In other words, the number of memory cells determined as on-cells in the read operation using the third read voltage R3' in the first loop Loop 1 is the number of data bits corresponding to a binary bit-value '11,' a binary bit-value '10,' and a binary bit-value '00' in the first loop Loop 1, and the number of memory cells determined as on-cells in the read operation using the third read voltage R3" in the second loop Loop 2 is the number of data bits corresponding to a binary bit-value '11,' a binary bit-value '10,' and a binary bit-value '00' in the second loop Loop 2. That is, the number of memory cells included in the third region can be extracted by subtracting the number of data bits corresponding to a binary bit-value '11,' a binary bit-value '10,' and a binary bit-value '00' in the first loop Loop 1 from the number of data bits corresponding to a binary bit-value '11,' a binary bit-value '10,' and a binary bit-value '00' in the second loop Loop 2. The counting operation and the subtracting and adding operations, which are described above, may be performed by the state counter 270 of FIG. 2.

Figure 12:
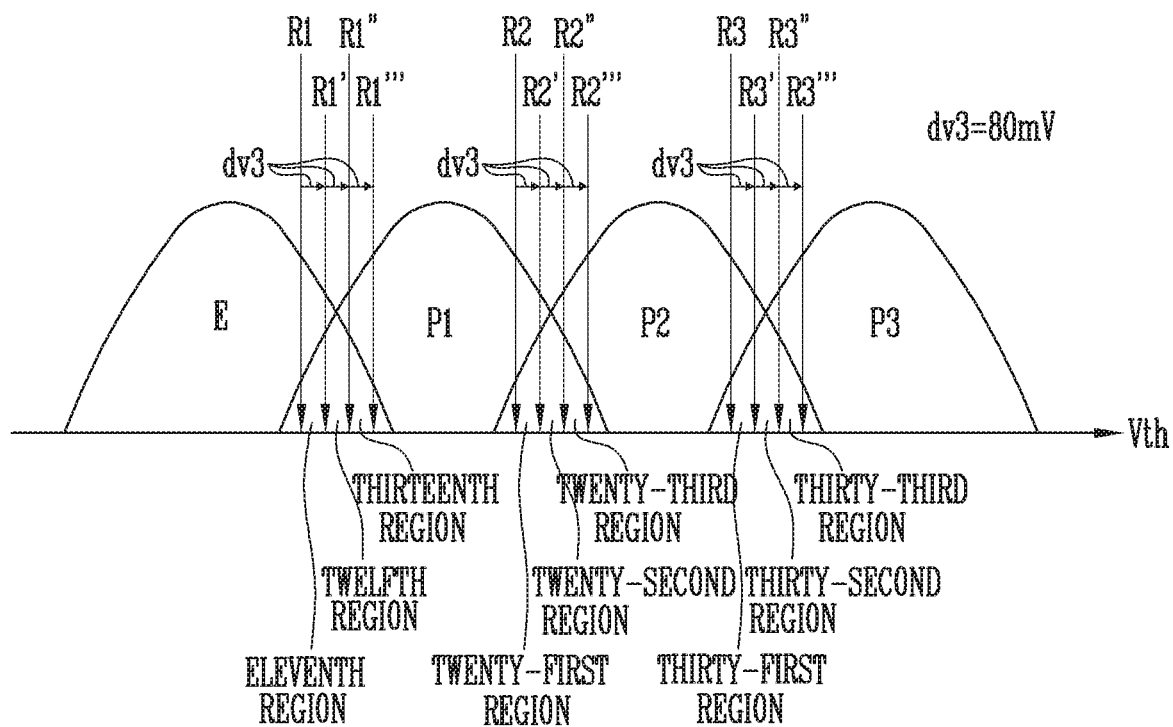

Referring to FIG. 12, when the above-described operation is repeatedly performed by changing offset voltages, the memory device 1100 may extract the entire threshold voltage distribution of memory cells. That is, when the memory device 1100 first performs the LSB read operation and the MSB operation, using first to third read voltages R1, R2, and R3 set as initial values and then performs the LSB read operation and the MSB operation, using first to third read voltages R1', R2', and R3' to which a third offset voltage dV3 is applied, a number of memory cells included in an eleventh region, a number of memory cells included in a twenty-first region, and a number of memory cells included in a thirty-first region may be extracted. Then, when the memory device 1100 performs the LSB read operation and the MSB operation, using first to third read voltages R1", R2", and R3" to which an offset voltage corresponding to two times of the third offset voltage dV3 is applied, a number of memory cells included in a twelfth region, a number of memory cells included in a twenty-second region, and a number of memory cells included in a thirty-second region may be additionally extracted. In addition, when the memory device 1100 performs the LSB read operation and the MSB operation, using first to third read voltages R1''', R2''', and R3''' to which an offset voltage corresponding to three times of the third offset voltage dV3 is applied, a number of memory cells included in a thirteen region, a number of memory cells included in a twenty-third region, and a number of memory cells included in a thirty-third region may be additionally extracted. If a read operation is repeatedly performed in this manner, the entire threshold voltage distribution of memory cells included in one physical page PPG can be extracted. In an embodiment, the third offset voltage dV3 may be 80 mV.

The above-described operation of extracting a threshold voltage distribution may be performed by inputting a user command and an offset voltage to the memory device 1100. Unlike the test read command sequence, the user command sequence is published to users as described above. Thus, a threshold voltage distribution of memory cells can be extracted using the user command sequence, without implementing a separate test read command sequence. Accordingly, the design overhead of the memory device 1100 can be decreased, and the time required to extract the threshold voltage distribution can be reduced.

Figure 13:
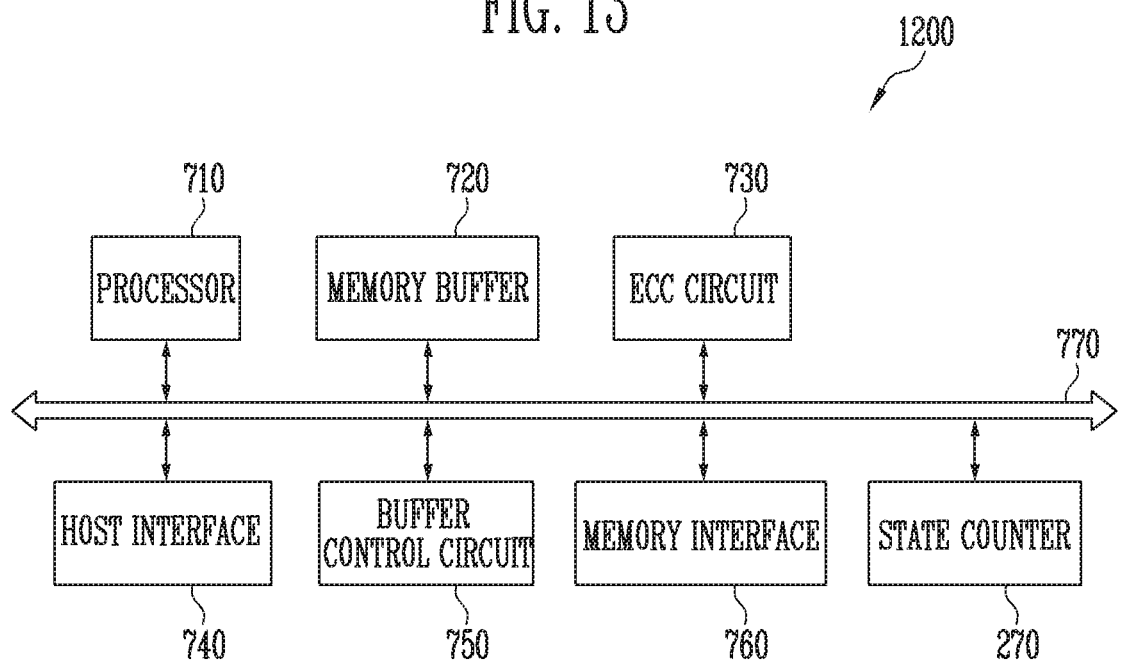
FIG. 13 is a diagram illustrating a memory controller according to an embodiment of the present disclosure.

FIG. 13 is a diagram illustrating the memory controller 1200 of FIG. 1 according to an embodiment of the present disclosure.

Referring to FIG. 13, the memory controller 1200 may include a processor 710, a memory buffer 720, an error correction code (ECC) circuit 730, a host interface 740, a buffer control circuit 750, a memory interface 760, and a bus 770.

The bus 770 may provide channels between components of the memory controller 1200.

The processor 710 may control overall operations of the memory controller 1200, and perform a logical operation. The processor 710 may communicate with the external host 2000 through the host interface 740, and communicate with the memory device 1100 through the memory interface 760. Also, the processor 710 may communicate with the memory buffer 720 through the buffer control circuit 750. The processor 710 may control an operation of the memory system 1000 by using the memory buffer 720 as a working memory, a cache memory, or a buffer memory.

The memory buffer 720 may be used as the working memory, the cache memory, or the buffer memory of the processor 710. The memory buffer 720 may store codes and commands, which are executed by the processor 710. The memory buffer 720 may include a static RAM (SRAM) or a dynamic RAM (DRAM).

The ECC circuit 730 may perform an ECC operation. The ECC circuit 730 may perform ECC encoding on data to be written in the memory device 1100 through the memory interface 760. The ECC encoded data may be transferred to the memory device 1100 through the memory interface 760. The ECC circuit 730 may perform ECC decoding on data received from the memory device 1100 through the memory interface 760. As an example, the ECC circuit 730 may be included as a component of the memory interface 760 in the memory interface 760.

The host interface 740 may communicate with the external host 2000 under the control of the processor 710. The host interface 740 may communicate with the host 2000, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 750 may control the memory buffer 720 under the control of the processor 710.

The memory interface 760 may communicate with the memory device 1100 under the control of the processor 710. The memory device 760 may communicate a command, an address, and data with the memory device 1100 through a channel.

In an embodiment, the memory controller 1200 may not include the memory buffer 720 and the buffer control circuit 750.

In an embodiment, the processor 710 may control an operation of the memory controller 1200, using codes. The processor 710 may load codes from a nonvolatile memory device (e.g., a read only memory (ROM)) provided inside the memory controller 1200. As an example, the processor 710 may load codes from the memory device 1100 through the memory interface 760.

In an embodiment, the bus 770 of the memory controller 1200 may be divided into a control bus and a data bus. The data bus may transmit data in the memory controller 1200, and the control bus may transmit control information such as a command and an address in the memory controller 1200. The data bus and the control bus are separated from each other, and may not interfere or influence with each other. The data bus may be coupled to the host interface 740, the buffer control circuit 750, the ECC circuit 730, and the memory interface 760. The control bus may be coupled to the host interface 740, the processor 710, the buffer control circuit 750, the memory buffer 720, and the memory interface 760.

The memory controller 1200 may also include a state counter 270. In other words, the state counter 270 may be included in the memory device 1100 as shown in FIG. 2 or be included in the memory controller 1200 as shown in FIG. 13. When the memory controller 1200 includes the state counter 270, the above-described user read command may be input to the memory device 1100 by the memory controller 1200. The memory device 1100 may perform an LSB read operation and an MSB read operation in response to the user read command transmitted from the memory controller 1200, and output data read through the LSB read operation and the MSB read operation to the memory controller 1200. The state counter 270 of the memory controller 1200 may extract a number of memory cells in a specific region through an operation including a subtracting operation on the data read through the LSB read operation and the MSB read operation, which is output from the memory device 1100. As a result, a threshold voltage distribution of memory cells can be extracted.

Figure 14:
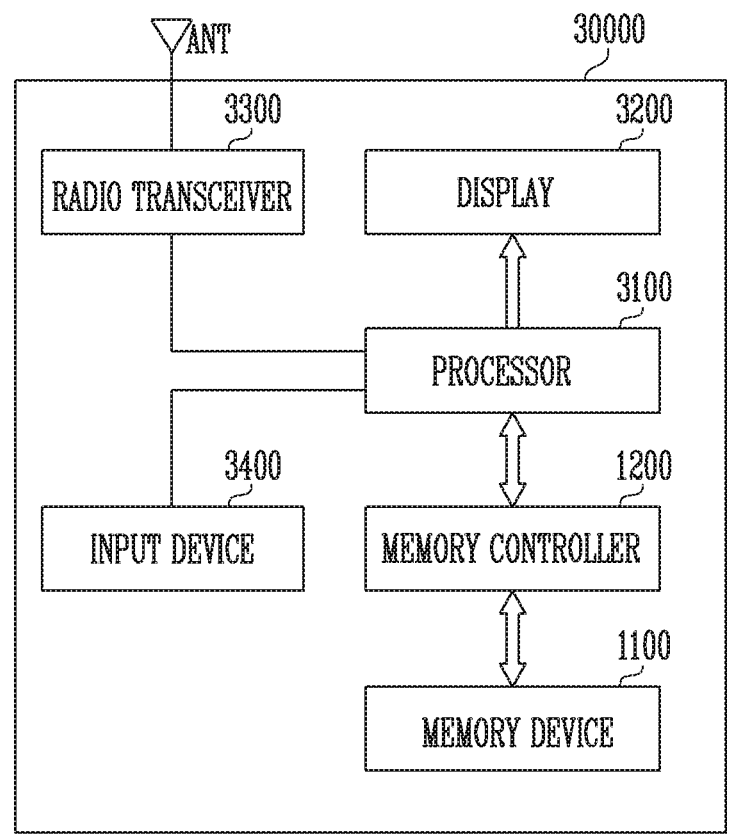
FIG. 14 is a diagram illustrating another embodiment of the memory system including the memory device shown in FIG. 2.

FIG. 14 is a diagram illustrating an application example of the memory system including the memory device shown in FIG. 2.

Referring to FIG. 14, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the semiconductor memory device 1100.

Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 15:
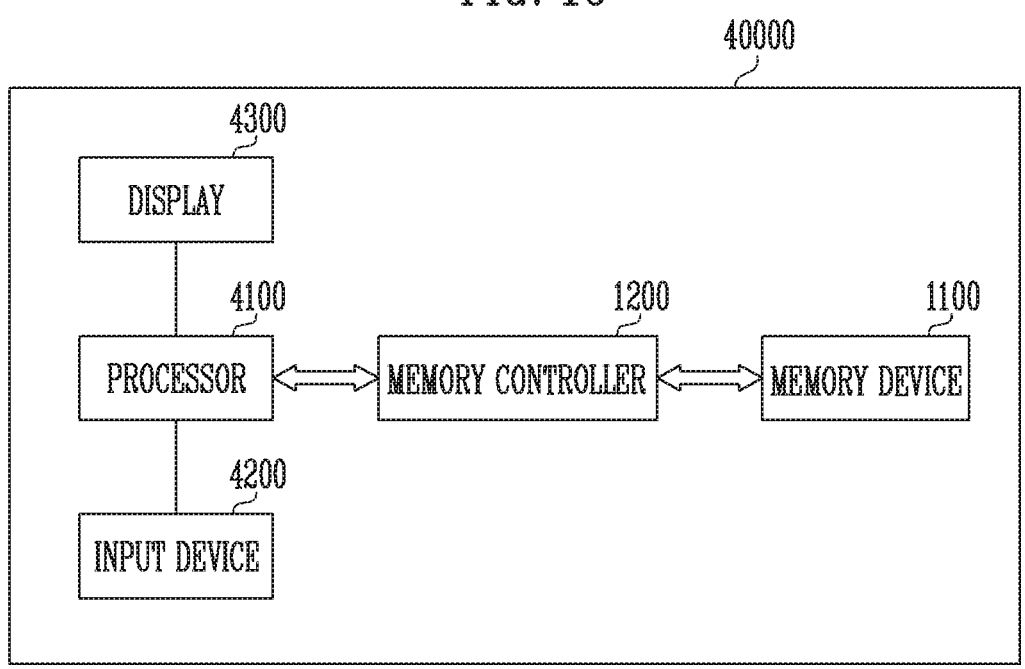
FIG. 15 is a diagram illustrating another embodiment of the memory system including the memory device shown in FIG. 2.

FIG. 15 is a diagram illustrating an application example of the memory system including the memory device shown in FIG. 2.

Referring to FIG. 15, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device to 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 16:
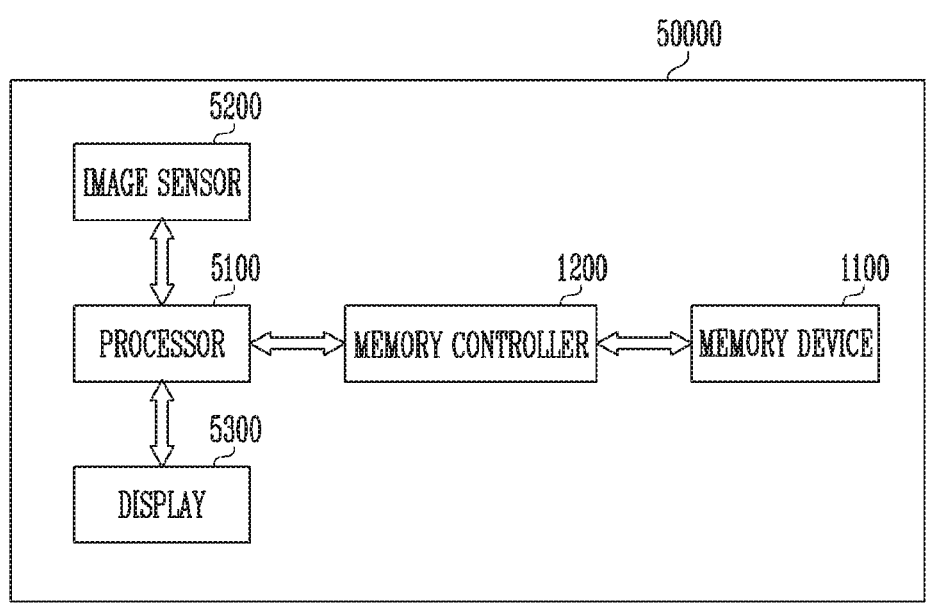
FIG. 16 is a diagram illustrating another embodiment of the memory system including the memory device shown in FIG. 2.

FIG. 16 is a diagram illustrating an application example of the memory system including the memory device shown in FIG. 2.

Referring to FIG. 16, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 17:
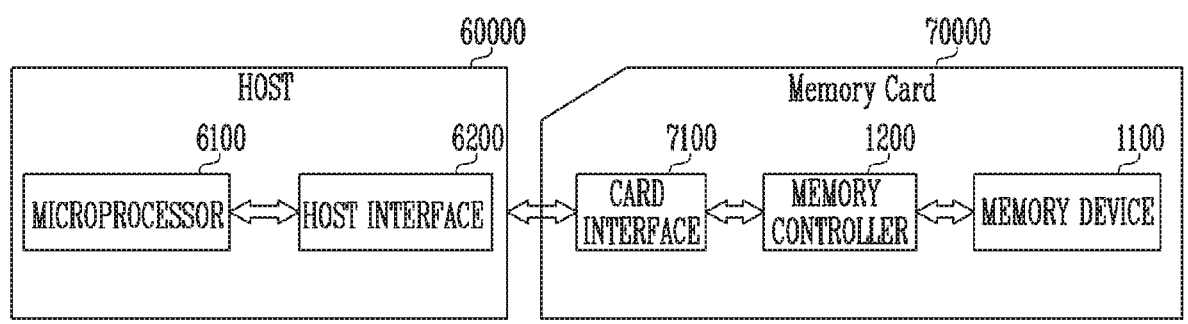
FIG. 17 is a diagram illustrating another embodiment of the memory system including the memory device shown in FIG. 2.

FIG. 17 is a diagram illustrating an application example of the memory system including the memory device shown in FIG. 2.

Referring to FIG. 17, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a mufti-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

According to an embodiment of the present disclosure, when a threshold voltage distribution of memory cells is extracted, a read operation is performed using a user read command and an offset voltage, so that a separate test read command is not required. Accordingly, the design overhead of the memory device can be decreased, and the time required to extract the threshold voltage distribution can be reduced.

Hereinafter, another embodiment of the present disclosure will be described with reference to FIG. 18 to FIG. 42.

Figure 18:
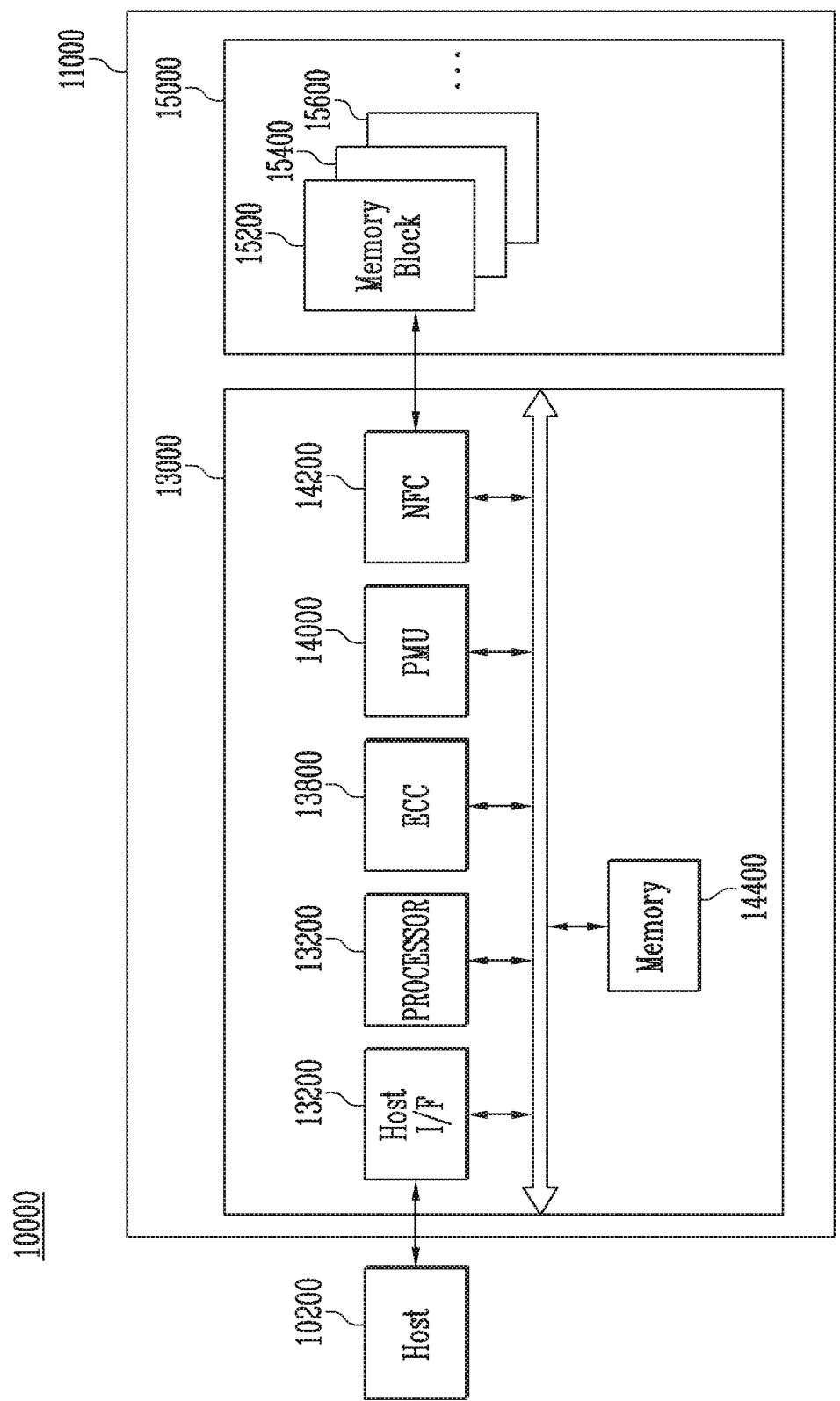
FIG. 18 is a block diagram illustrating a data processing system including a memory system in accordance with an embodiment of the present disclosure.

FIG. 18 is a block diagram illustrating a data processing system 10000 including a memory system 11000 in accordance with an embodiment of the present disclosure.

Referring to FIG. 18, the data processing system 10000 may include a host 10200 operatively coupled to the memory system 11000.

The host 10200 may be any suitable electronic device including portable electronic devices such as a mobile phone, MP3 player and laptop computer or non-portable electronic devices such as a desktop computer, game machine, television (TV) and projector. The host 10200 may include at least one operating system (OS), and the OS may manage and control the overall functions and operations of the host 10200, and also provide an operation between the host 10200 and a user using the data processing system 10000 or the memory system 11000. The OS may support functions and operations corresponding to the use purpose and usage of a user. For example, the OS may be divided into a general OS and a mobile OS, depending on the mobility of the host 10200. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 10200 may include one or more of Oss. The host 10200 may execute an OS to perform an operation corresponding to a user's request on the memory system 11000.

The memory system 11000 may operate to store data for the host 10200 in response to a request of the host 10200. Non-limited examples of the memory system 11000 may include a solid state drive (SSD), a multi-media card (MMC), a secure digital (SD) card, universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, The SD card may include a mini-SD card and micro-SD card.

The memory system 11000 may be embodied by various types of storage devices. Non-limited examples of storage devices included in the memory system 11000 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensioanl (3D) stack structure.

The memory system 11000 may include a memory device 15000 and a controller 13000. The memory device 15000 may store data for the host 12000, and the controller 13000 may control data storage into the memory device 15000.

The controller 13000 and the memory device 15000 may be integrated into a single semiconductor device, which may be included in the various types of memory systems as exemplified above.

Non-limited application examples of the memory system 11000 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFI©) device, or one of various components constituting a computing system.

The memory device 15000 may be a nonvolatile memory device and may retain data stored therein even though power is not supplied. The memory device 15000 may store data provided from the host 10200 through a write operation, and provide data stored therein to the host 10200 through a read operation. The memory device 15000 may include a plurality of memory dies (not shown), each memory die including a plurality of planes (not shown), each plane including a plurality of memory blocks 15200 to 15600, each of the memory blocks 15200 to 15600 may include a plurality of pages, and each of the pages may include a plurality of memory cells coupled to a word line.

The controller 13000 may control the memory device 15000 in response to a request from the host 10200. For example, the controller 13000 may provide data read from the memory device 15000 to the host 10200, and store data provided from the host 10200 into the memory device 15000. For this operation, the controller 13000 may control read, write, program and erase operations of the memory device 15000.

The controller 13000 may include a host interface (I/F) unit 13200, a processor 13400, an error correction code (ECC) unit 13800, a Power Management Unit (PMU) 14000, a NAND flash controller (NFC) 14200 and a memory 14400 all operatively coupled via an internal bus.

The host interface unit 13200 may be configured to process a command and data of the host 10200, and may communicate with the host 10200 through one or more of various interface protocols such as universal serial bus (USB), multi-media card (MMC), peripheral component interconnect-express (PCI-e), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 13800 may detect and correct an error contained in the data read from the memory device 15000. In other words, the ECC unit 138 may perform an error correction decoding process to the data read from the memory device 15000 through an ECC code used during an ECC encoding process. According to a result of the error correction decoding process, the ECC unit 13800 may output a signal, for example, an error correction success/fail signal. When the number of error bits is more than a threshold value of correctable error bits, the ECC unit 13800 may not correct the error bits, and may output an error correction fail signal.

The ECC unit 13800 may perform error correction through a coded modulation such as Low Density Parity Check (LDPC) code, Bose-Chaudhri-Hocquenghem (BCH)

code, turbo code, Reed-Solomon code, convolution code, Recursive Systematic Code (RSC), Trellis-Coded Modulation (TCM) and Block coded modulation (BCM). However, the ECC unit 13800 is not limited thereto. The ECC unit 13800 may include all circuits, modules, systems or devices for error correction.

The PMU 14000 may provide and manage powerof he controller 130.

The NFC 14200 may serve as a memory/storage interface for interfacing the controller 13000 and the memory device 15000 when the memory device is a NAND flash memory, such that the controller 13000 controls the memory device 15000 in response to a request from the host 10200. When the memory device 15000 is a flash memory or specifically a NAND flash memory, the NFC 14200 may generate a control signal for the memory device 15000 and process data to be provided to the memory device 15000 under the control of the processor 13400. The NFC 14200 may work as an interface (e.g., a NAND flash interface) for processing a command and data between the controller 130 and the memory device 15000. Specifically, the NFC 14200 may support data transfer between the controller 13000 and the memory device 15000. Other memory/storage interfaces may be used when a different type memory device is employed.

The memory 14400 may serve as a working memory of the memory system 11000 and the controller 13000, and store data for driving the memory system 11000 and the controller 13000. The controller 13000 may control the memory device 15000 to perform read, write, program and erase operations in response to a request from the host 10200. The controller 13000 may provide data read from the memory device 15000 to the host 10200, may store data provided from the host 10200 into the memory device 15000. The memory 14400 may store data required for the controller 13000 and the memory device 15000 to perform these operations.

The memory 14400 may be embodied by a volatile memory. For example, the memory 14400 may be embodied by static random access memory (SRAM) or dynamic random access memory (DRAM). The memory 14400 may be disposed within or out of the controller 13000. FIG. 18 exemplifies the memory 14400 disposed within the controller 13000. In an embodiment, the memory 14400 may be embodied by an external volatile memory having a memory interface transferring data between the memory 14400 and the controller 13000.

The processor 13400 may control the overall operations of the memory system 11000. The processor 13400 may drive firmware to control the overall operations of the memory system 11000. The firmware may be referred to as flash translation layer (FTL).

The processor 13400 of the controller 13000 may include a management unit (not illustrated) for performing a bad management operation of the memory device 15000. The management unit may perform a bad block management operation of checking a bad block, in which a program fail occurs due to the characteristic of a NAND flash memory during a program operation, among the plurality of memory blocks 15200 to 15600 included in the memory device 15000. The management unit may write the program-failed data of the bad block to a new memory block. In the memory device 15000 having a 3D stack structure, the bad block management operation may reduce the use efficiency of the memory device 15000 and the reliability of the memory system 11000. Thus, the bad block management operation needs to be performed with more reliability.

Figure 19:
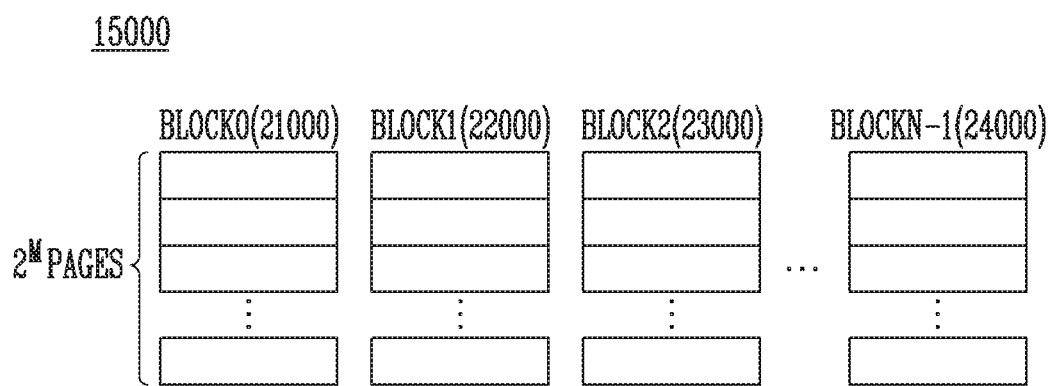
FIG. 19 is a schematic diagram illustrating an exemplary configuration of a memory device employed in the memory system of FIG. 18.

FIG. 19 is a schematic diagram illustrating an exemplary configuration of the memory device 15000 employed in the memory system 11000 shown in FIG. 18.

Referring to FIG. 19, the memory device 15000 may include a plurality of memory blocks 0 to N-1, and each of the blocks 0 to N-1 may include a plurality of pages, for example, 2m pages, the number of which may vary according to circuit design. Memory cells included in the respective memory blocks 0 to N-1 may be one or more of a single level cell (SLC) storing 1-bit data, a multi-level cell (MLC) storing 2-bit data, an MLC storing 3-bit data also referred to as a triple level cell (TLC), an MLC storing 4-bit data also referred to as a quadruple level cell (QLC), or an MLC storing 5-bit or more bit data.

Figure 20:
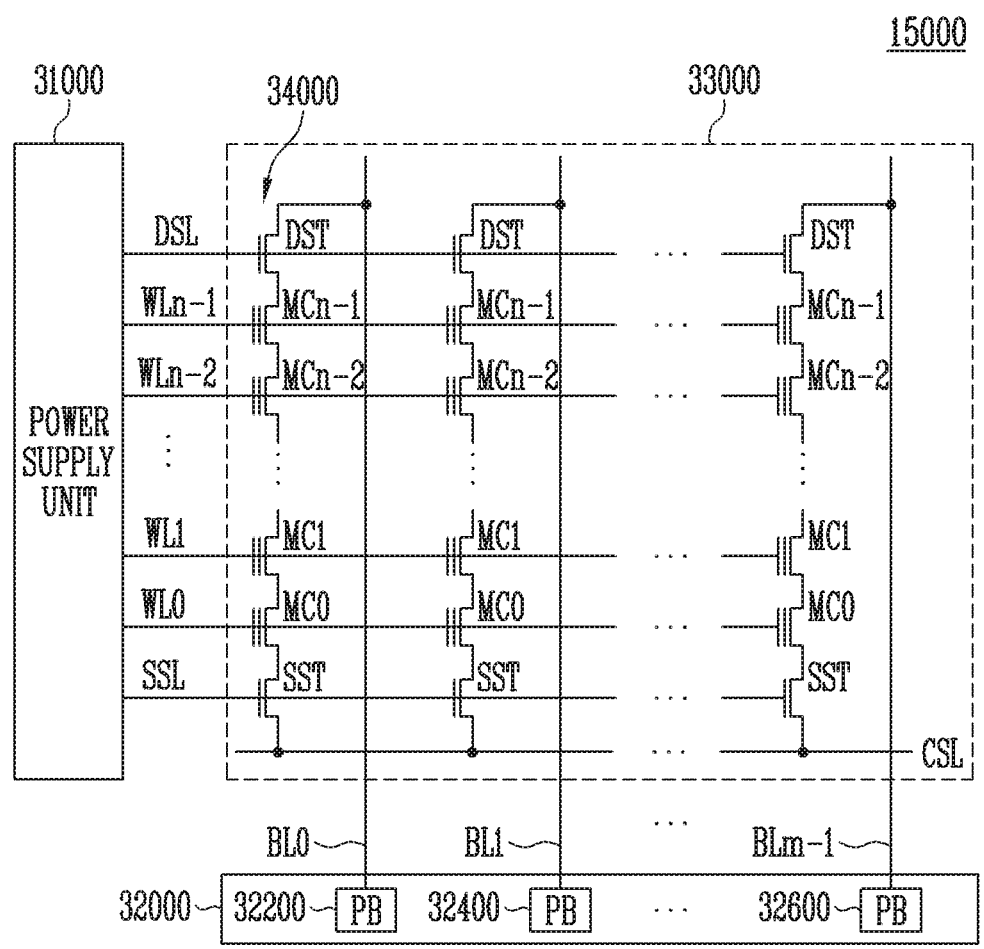
FIG. 20 is a circuit diagram illustrating an exemplary configuration of a memory cell array of a memory block in the memory device shown in FIG. 19.

FIG. 20 is a circuit diagram illustrating an exemplary configuration of a memory cell array of a memory block in the memory device 15000 of FIG. 19.

Referring to FIG. 20, a memory block 33000 which may correspond to any of the plurality of memory blocks 15200 to 15600 included in the memory device 15000 of the memory system 11000 may include a plurality of cell strings 34000 coupled to a plurality of corresponding bit lines BL0 to BLm-1. The cell string 34000 of each column may include one or more drain select transistors DST and one or more source select transistors SST. Between the drain and select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 34000 may be electrically coupled to a corresponding bit line among the plurality of bit lines BL0 to BLm-1. For example, as illustrated in FIG. 20, the first cell string is coupled to the first bit line BL0, and the last cell string is coupled to the last bit line BLm-1.

Although FIG. 20 illustrates NAND flash memory cells, the invention is not limited in this way. For example, it is noted that the memory cells may be NOR flash memory cells, or hybrid flash memory cells including two or more kinds of memory cells combined therein. Also, it is noted that the memory device 15000 may be a flash memory device including a conductive floating gate as a charge storage layer or a charge trap flash (CTF) memory device including an insulation layer as a charge storage layer.

The memory device 15000 may further include a voltage supply unit 31000 which provides word line voltages including a program voltage, a read voltage and a pass voltage to supply to the word lines according to an operation mode. The voltage generation operation of the voltage supply unit 31000 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 15000 may include a read/write circuit 32000 which is controlled by the control circuit. During a verification/normal read operation, the read/write circuit 32000 may operate as a sense amplifier for reading data from the memory cell array. During a program operation, the read/write circuit 32000 may operate as a write driver for driving bit lines according to data to be stored in the memory cell array. During a program operation, the read/write circuit 32000 may receive from a buffer (not illustrated) data to be stored into the memory cell array, and drive bit to lines according to the received data. The read/ write circuit 32000 may include a plurality of page buffers 32200 to 32600 respectively corresponding to columns (or bit lines) or column pairs (or bit line pairs), and each of the page buffers 32200 to 32600 may include a plurality of latches (not illustrated).

Figure 21:
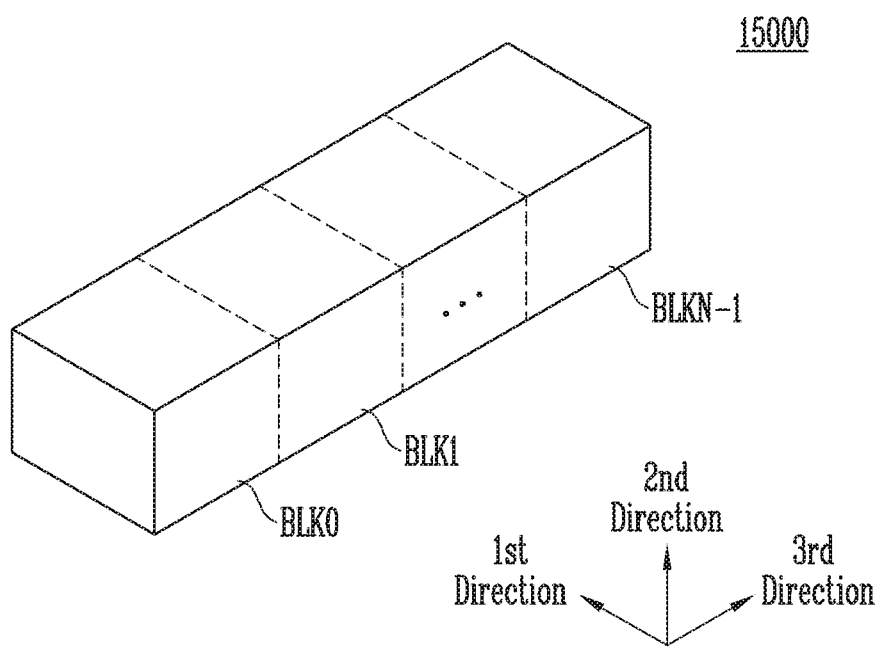
FIG. 21 is a schematic diagram illustrating an exemplary three-dimensional structure of the memory device shown in FIG. 19.

FIG. 21 is a schematic diagram illustrating an exemplary three-dimensional (3D) structure of the memory device 15000 of FIG. 19.

The memory device 15000 may be embodied by a two-dimensional (2D) or three-dimensional (3D) memory device. Specifically, as illustrated in FIG. 21, the memory device 15000 may be embodied by a nonvolatile memory device having a 3D stack structure. When the memory device 15000 has a 3D structure, the memory device 15000 may include a plurality of memory blocks BLK0 to BLKN-1 each having a 3D structure (or vertical structure).

In the above-described memory device (for example, NAND flash memory), a read error may occur due to retention, read disturb or a difference between the temperature of the storage device during a programming (or write) of a data and the temperature of the storage device during reading of the same data. When a read error occurs, a read operation may be re-performed while read voltage levels contained in a predefined read retry table are applied in a predetermined order. The read operation may be re-performed until the read operation is successfully performed or all of the read voltage levels in the table are applied.

Figure 22:
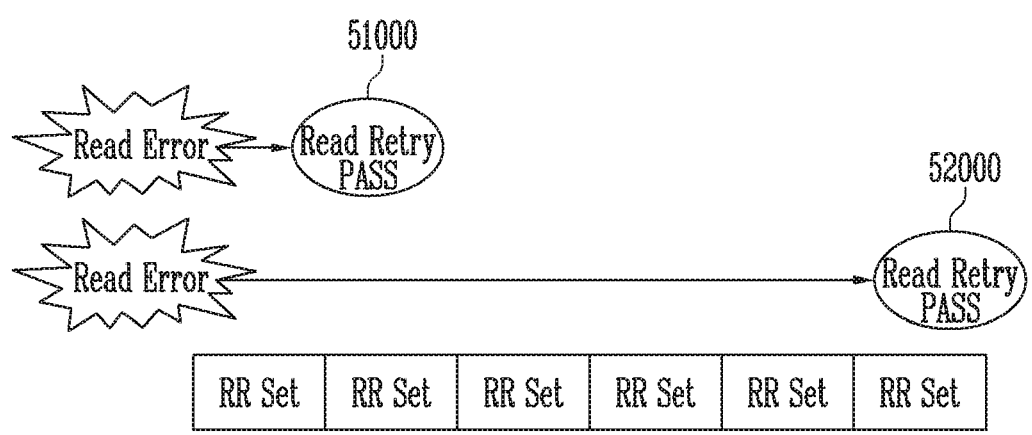
FIG. 22 is a diagram illustrating an example in which read retry operations are performed according to a predetermined order.
Figure 23:
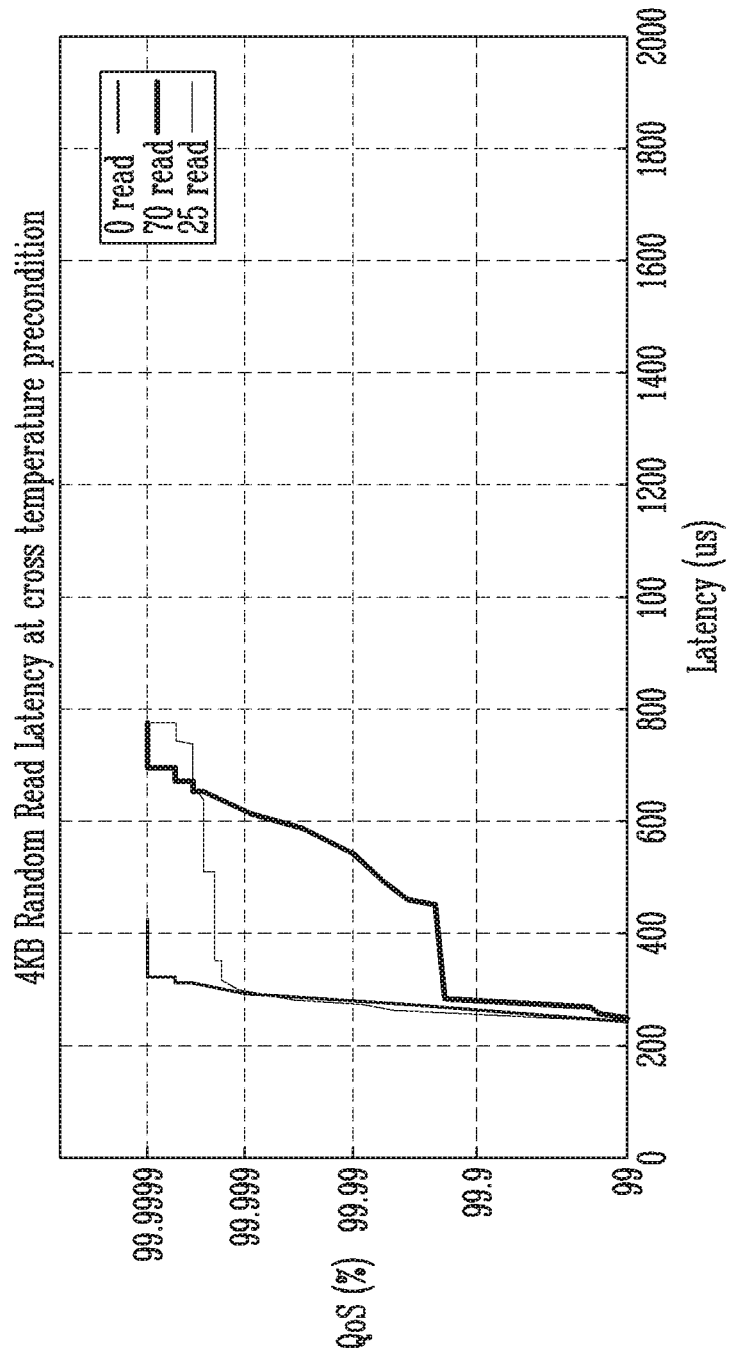
FIG. 23 is a diagram illustrating an example in which a latency difference occurs depending on the number of read retry operations for the same defect.

In general, since a read error may be caused by a plurality of different type defects in a memory device, the read retry table may include a plurality of retry sets corresponding to the respective types of the defects as illustrated in FIG. 22. Since a read retry operation according to the related art is performed in a fixed order, the read retry operation may require a large amount of time. For example, in the best case, a read operation may be successfully performed at the first step 51000. In the worst case, however, a read operation may be successfully performed at the final step 52000. Besides, although read retry operations are performed for the same defect as illustrated in FIG. 23, a latency difference may occur depending on the number of read retry operations.

Various embodiments of the present invention provide a read retry method that determines an occurrence possibility for each defect type when a read error occurs, and performs a read retry operation based on a retry set that is selected based a descending order of the occurrence possibility for each type of defect. In an embodiment, the read retry method can predict which defects are more likely to occur for each storage region of a memory storage device, for example, each block, die or page, and perform a read retry operation for an error occurring in a storage region by selecting a read retry set from a read retry table which corresponds to the defect having the highest occurrence possibility for the storage region, thereby shortening a time required for the error correction.

Figure 24A:
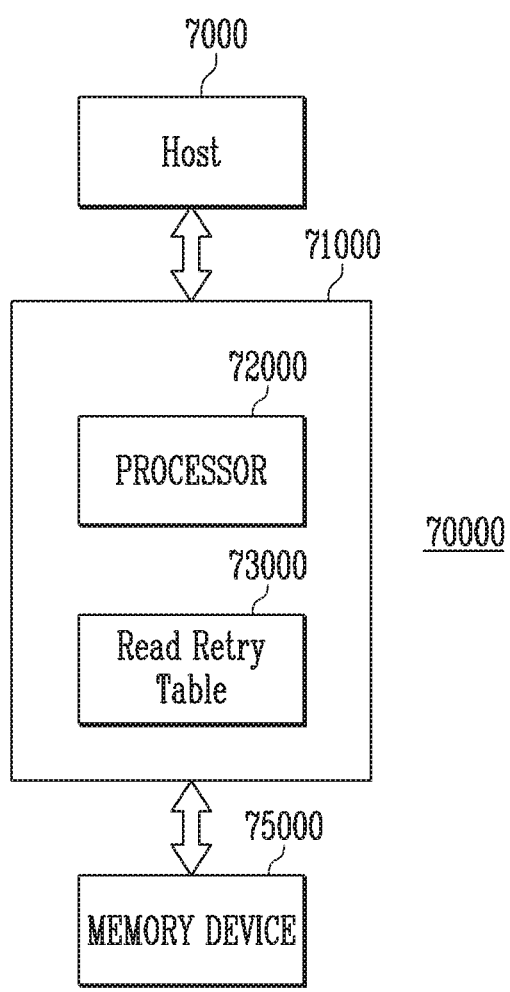
FIG. 24A is a diagram illustrating a data processing system in accordance with an embodiment.

FIG. 24A is a diagram illustrating a data processing system in accordance with an embodiment.

Referring to FIG. 24A, the data processing system may include a host 7000 and a memory system (or storage device) 70000. The memory system 70000 may include a controller 71000 and a memory device 75000. The controller 71000 and the memory device 75000 of FIG. 24A may correspond to the controller 13000 and the memory device 15000 of FIG. 18, respectively. The controller 71000 and the memory device 75000 may perform operations corresponding to the controller 13000 and the memory device 15000 of FIG. 18, respectively. For convenience of description, however, the controller 71000 and the memory device 75000 may be limited to an example in which the controller 71000 and the memory device 75000 perform a read retry operation in accordance with the present embodiment.

The memory device 75000 may include a plurality of storage regions. For example, the memory device 75000 may include a plurality of memory chips. Each of the memory chips may be divided into a plurality of dies, and each of the dies may be divided into a plurality of planes. Each of the planes may include a plurality of blocks, and each of the blocks may include a plurality of pages.

The controller 71000 may be coupled between the host 7000 and the memory device 75000, and perform various operations such as read, write and erase operations, according to a request of the host 7000. The controller 71000 may perform a read operation on any one storage region among the plurality of storage regions included in the memory device 75000. When a read error occurs during a read operation, the controller 71000 may perform various retry operations such as a read retry operation. The controller 71000 may include a processor 72000 and a read retry table 73000. For example, the processor 72000 may correspond to the processor 13400 illustrated in FIG. 18. For another example, the processor 72000 may correspond to the processor 13400 and the NFC 14200 which are illustrated in FIG. 18.

In accordance with various embodiments, when a read error occurs in a storage region among the plurality of storage regions included in the memory device 75000, the processor 72000 of the controller 71000 may perform a read retry operation based on the respective occurrence possibilities of a plurality of different type of defects which may be the cause of the detected error in the storage region. The processor 72000 may then perform the read retry operation by referring to the read retry table 73000.

Figure 31:
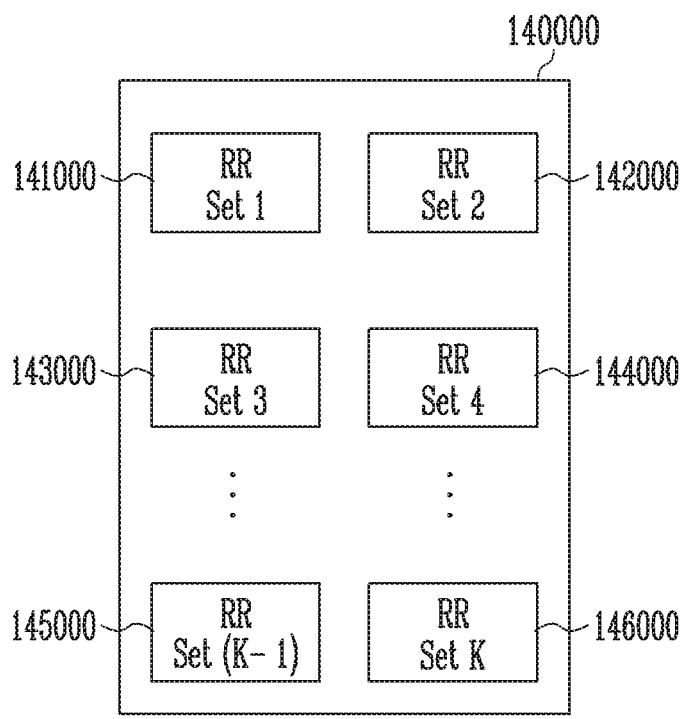
FIG. 31 is a diagram illustrating an example in which a read retry table is provided for a plurality defects in accordance with an embodiment.

The read retry table 73000 may include a plurality of read retry sets corresponding to the respective defects which are likely to occur in the memory device 75000. The read retry table 73000 may also include a list of the possible defects in a descending order of occurrence possibility for each of the storage regions of the memory device. For example, the read retry table 73000 may include K read retry sets as illustrated in FIG. 31. The processor 72000 may select, from the read retry table 73000, a read retry set in a descending order of the occurrence possibility of a type of defect in the storage region in which the error occurred. The processor 72000 will terminate the read retry operation when the error is corrected.

By selecting a read retry set that is optimized for each region, the controller 71000 may reduce the time required for the read retry operation substantially.

Figure 24B:
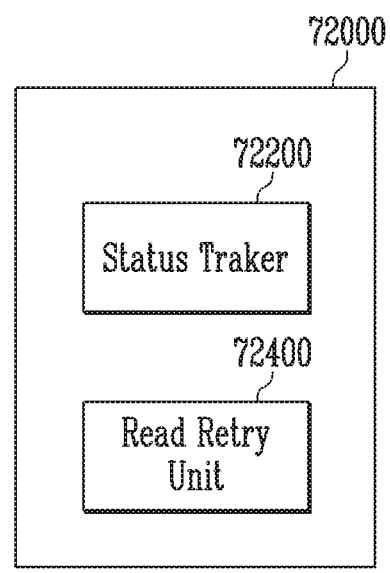
FIG. 24B is a diagram illustrating a processor in accordance with an embodiment.

FIG. 24B is a diagram illustrating the processor 72000 of FIG. 24A.

Referring to FIG. 24B, the processor 72000 may include a status tracker 72200 and a read retry unit 72400. The status tracker 72200 may track and write status information on the plurality of storage regions included in the memory device 75000. In various embodiments, the status information may include one or more of an erase/write (E/W) cycle count, a read count and temperature information. The E/W cycle count may include an E/W cycle count for one block. The read count may include a read count for one page. The temperature information may include information on a temperature measured in the controller 71000 or the memory device 75000.

When a read error occurs in a storage region included in the memory device 75000, the read retry unit 72400 may determine the occurrence possibilities for each of the plurality of possible different type of defects, based on the status information tracked by the status tracker 72200 for the storage region where the error occurred. The read retry unit 72400 may sort the plurality of defects in descending order of their occurrence possibilities, and perform read retry operations according to a read retry set selected according to the sorted defect order. The read retry unit 72400 may select a read retry set among the plurality of read retry sets included in the read retry table 73000, according to the sorted defect order, and perform a read retry operation on the any one storage region using the selected read retry set.

Figure 25:
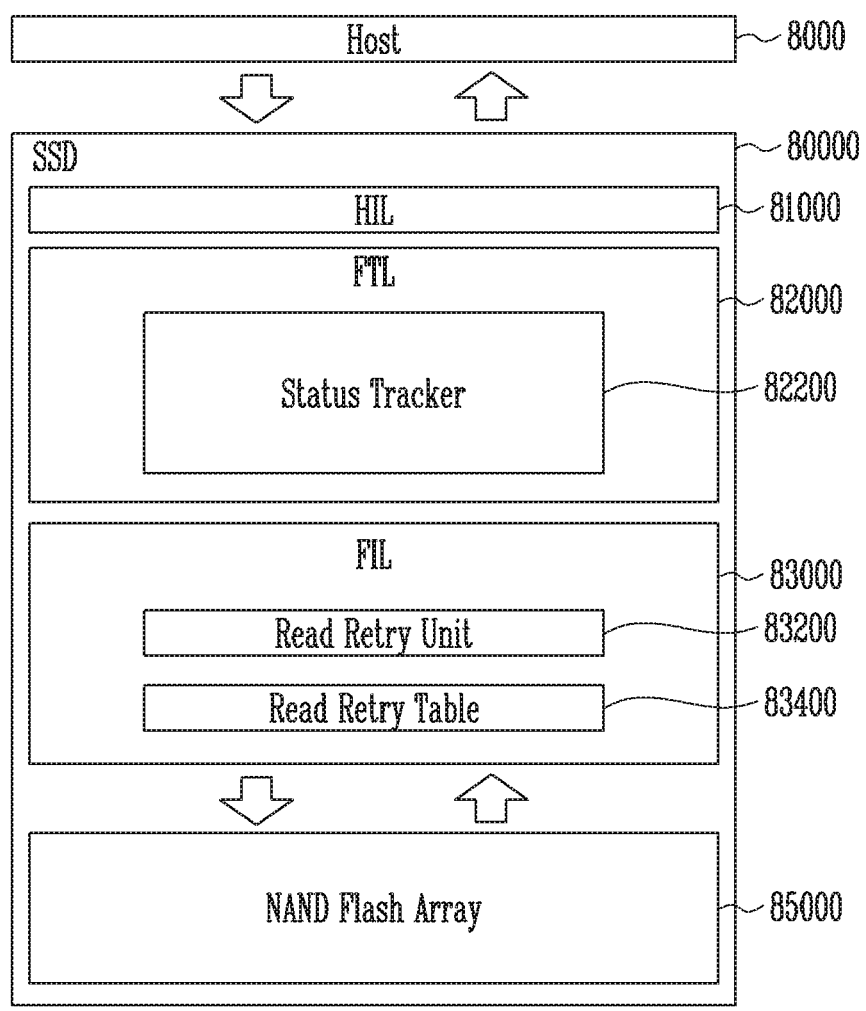
FIG. 25 is a diagram illustrating a data processing system in accordance with another embodiment.

FIG. 25 is a diagram illustrating a data processing system in accordance with another embodiment.

Referring to FIG. 25, the data processing system may include a host 8000 and a solid state drive (SSD) 80000 serving as a memory system (or storage device). The host 80 may request various operations such as read, write and erase operations for the SSD 80000. The SSD 80000 may include a NAND flash array 85000 as a storage medium including a plurality of storage regions. The NAND flash array 85000 may include a plurality of blocks, and each of the blocks may include a plurality of pages.

The SSD 80000 may include a controller that stores data provided from the host 8000 into the NAND flash array 85000 in response to a write request from the host 8000, or reads data stored in the NAND flash array 85000 and provide the read data to the host 8000 in response to a read request. The controller may be divided into a host interface layer (HIL) 81000, a flash translation layer (FTL) 820 and a flash interface layer (FIL) 83000. The HIL 81000 may serve as a layer for an interface with the host 80, the FIL 83000 may serve as a layer for an interface with the NAND flash array 85000, and the FTL 82000 may serve as a layer for translating data transmitted/received between the host 80 and the NAND flash array 85000. The HIL 81000 and the FIL 83000 may correspond to the host interface 13200 and the NFC 14200 of the controller 13000 illustrated in FIG. 18, respectively, and the FTL 82000 may correspond to the other components of the controller 13000 illustrated in FIG. 18. For convenience of description, the operations of the HIL 81000, the FTL 82000 and the FIL 83000 may be limited to an example in which the HIL 81000, the FTL 82000 and the FIL 83000 perform a read retry operation in accordance with the present embodiment.

The SSD 80000 may perform various retry methods such as a read retry operation for a successful read operation, when a read error occurs. When a read error occurs even though all of the methods were used, a read fail will occur. For a read retry operation in accordance with various embodiments, the FTL 82000 may include a status tracker 82200, and the FIL 83000 may include a read retry unit 83200 and a read retry table 83400.

The status tracker 82200 may track and write status information on a plurality of storage regions (for example, blocks, dies or pages) included in the flash array 85000. In various embodiments, the status information may include one or more of an erase/write (E/W) cycle count, a read count and temperature information. The E/W cycle count may include an E/W cycle count for one block. The read count may include a read count for one page. The temperature information may include information on a temperature measured by the controller or flash array 85000 of the SSD 80000.

When a read error occurs in any one storage region among the plurality of storage regions included in the flash array 85000, the read retry unit 83200 may determine occurrence possibilities for a plurality of different type of defects, respectively, based on the status information for the storage region tracked by the status tracker 82200. The read retry unit 83200 may sort the plurality of defects in descending order of the occurrence possibilities, and perform read retry operations according to the sorted defect order. The read retry unit 83200 may select a read retry set among the plurality of read retry sets included in the read retry table 83400, according to the sorted defect order, and perform a read retry operation on the any one storage region using the selected read retry set.

Figure 26:
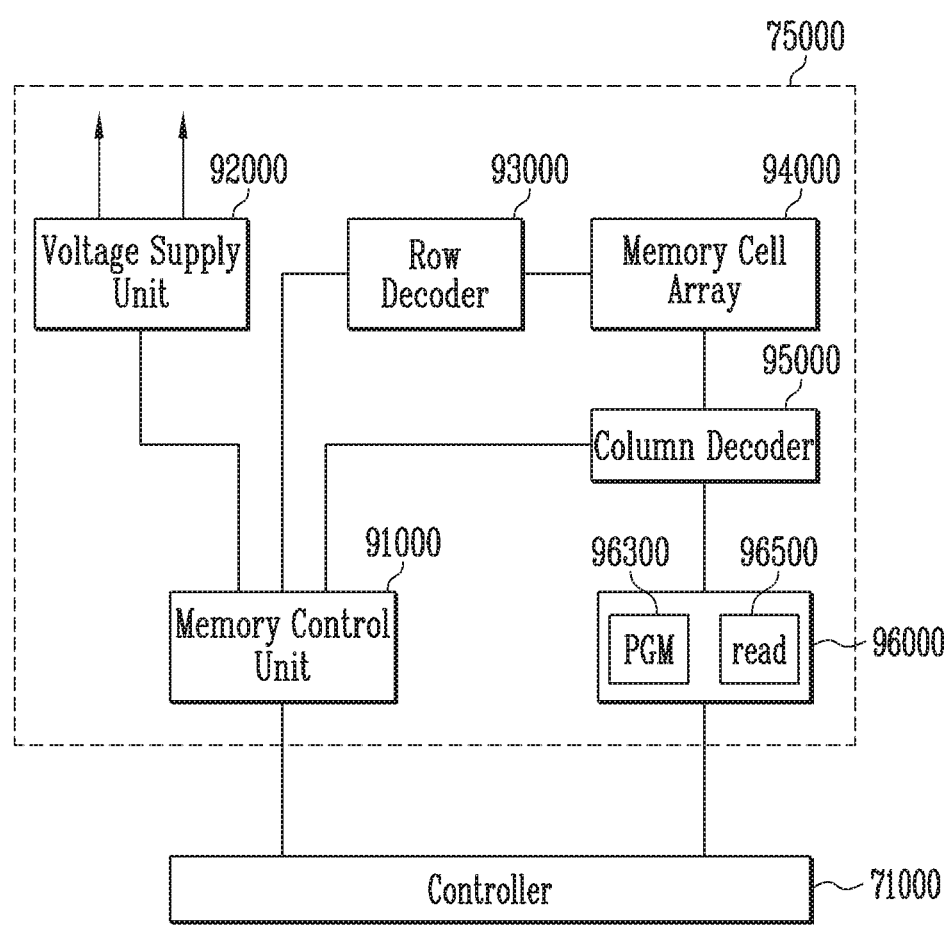
FIG. 26 is a diagram illustrating a memory device in accordance with an embodiment.

FIG. 26 is a diagram illustrating the memory device 75000 of FIG. 24A in accordance with various embodiments.

Referring to FIG. 26, the memory device 75000 may include a memory control unit 91000, a voltage supply unit 92000, a row decoder 93000, a memory cell array 94000, a column decoder 95000 and a program/read circuit 96000.

The memory device 75000 may include a flash memory device such as NAND flash or NOR flash, ferroelectrics random access memory (FeRAM), phase-change random access memory (PCRAM), magnetic random access memory (MRAM) or resistive random access memory (ReRAM).

The memory cell array 94000 may be coupled to a plurality of word lines WL and a plurality of bit lines BL. The memory cell array 94000 may include a plurality of memory cells arranged at the respective intersections between the plurality of word lines WL and the plurality of bit lines BL. The memory cell array 94000 may receive an address ADDR for indicating a memory cell to be accessed with a command CMD. The address ADDR may include a row address X_ADDR for selecting word lines WL of the memory cell array 94000 and a column address Y_ADDR for selecting a bit line of the memory cell array 94000.

The row decoder 93000 may be coupled to the memory cell array 94000 through the word lines WL, and select one or more of the word lines in response to the row address X_ADDR from the memory control unit 91000. The column decoder 95000 may be coupled to the memory cell array 94000 through the bit lines BL, and select one or more of the bit lines in response to the column address Y_ADDR from the memory control unit 91000.

The program/read circuit 96000 may include a program circuit 96300 and a read circuit 96500. The program circuit 96300 may be coupled to a bit line BL selected through the column decoder 95000, and perform a program operation (or data write operation) by providing a program pulse to a selected memory cell of the memory cell array 94000. The read circuit 96500 may be coupled to a bit line BL selected through the column decoder 95000, sense the level of a selected memory cell of the memory cell array 94000, and read (or output) data stored therein. The read circuit 96500 may output data to the outside of the memory device 75000, for example, the controller 71000.

The voltage supply unit 92000 may generate various types of voltages for performing program, read and erase operations on the memory cell array 94000, based on voltage control of the memory control unit 91000. The voltage supply unit 92000 may generate driving voltages (or bias voltages) for driving the plurality of word lines WL and bit lines BL through the row decoder 93000 and the column decoder 95000, respectively. Then, the voltage supply unit 92000 may provide the row decoder 93000 and the column decoder 95000 with the corresponding driving voltages. For example, the driving voltages may include a program voltage, reset voltage, read voltage and cutoff voltage.

The memory control unit 91000 may output voltage control signals to the voltage supply unit 92000, based on a command CMD, an address ADDR and a control signal CTRL, which are received from the controller 71000. The voltage control signals may be used to program data to the memory cell array 94000 or read data from the memory cell array 94000. The voltage control signals outputted from the memory control unit 91000 may be provided to the program/read circuit 96000, the voltage supply unit 92000, the row decoder 93000 and the column decoder 95000. The memory control unit 91000 may control overall operations of the memory device 75000.

In accordance with the various embodiments, the memory control unit 91000 may read data stored in the memory cell array 94000 and output the read data to the controller 71000, based on the command CMD, the address ADDR and the control signal CTRL, which are received from the controller 71000. At this time, the memory control unit 91000 may output voltage control signals for reading data from the memory cell array 94000 to the voltage supply unit 92000.

When a read error occurred, the memory control unit 91000 may receive information on a read voltage level for read retry, provided from the controller 71000, that is, a voltage control signal, and output the voltage control signal to the voltage supply unit 92000 such that the corresponding read voltage is supplied to the memory cell array 94000.

In accordance with various embodiments, the read retry table may be included in the memory controller 71000 as illustrated in FIGS. 24A and 24B. Alternatively, the read retry table may be included in the memory device 75000.

Figure 27:
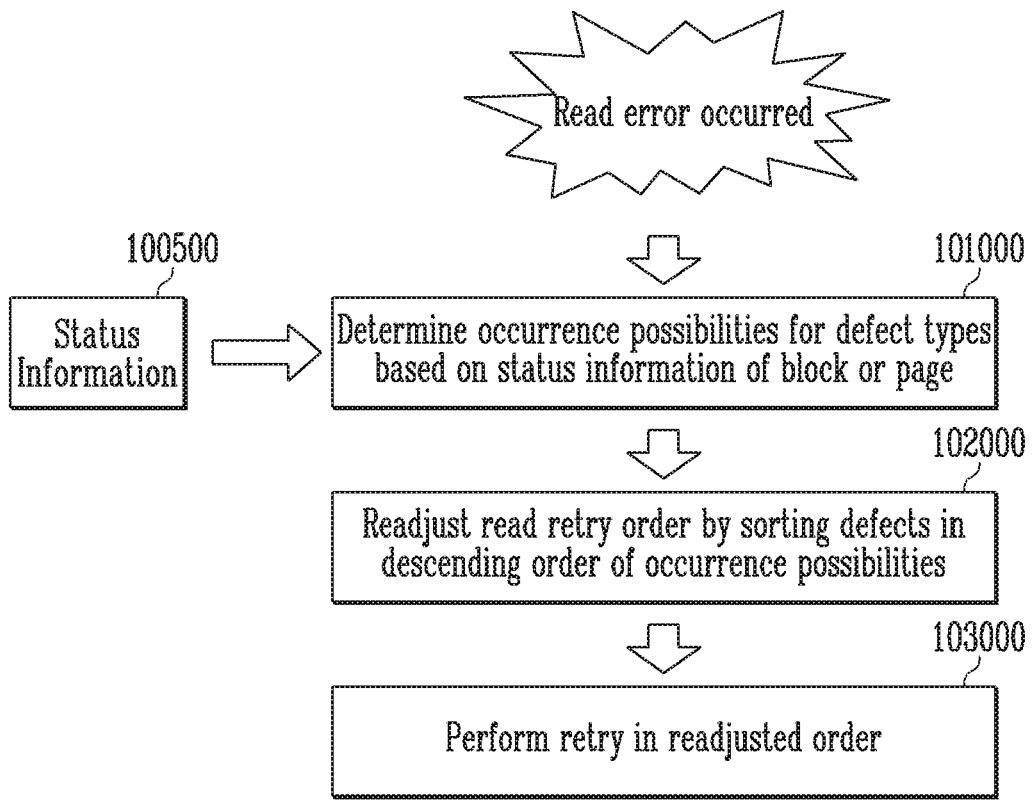
FIG. 27 is a diagram illustrating a flow of a read retry operation in accordance with an embodiment.

FIG. 27 is a diagram illustrating a flow of the read retry operation in accordance with an embodiment. This read retry operation may be performed by the memory controller 71000 illustrated in FIGS. 24A and 24B and/or the controller of the SSD 80000 illustrated in FIG. 25.

Referring to FIG. 27, a read error may occur in any one storage region among the plurality of storage regions included in the memory device, for example, 75000 of FIGS. 24A and 24B.

When the read error occurs, the controller may determine occurrence possibilities for the plurality of different type of defects, respectively, based on status information 100500 on the storage region (for example, block or page) where the error occurred at step 101000. That is, the controller may determine the occurrence possibility for each defect type for the region where the error occurred.

At step 102000, the controller may readjust a read retry order by sorting the plurality of defects in descending order of the occurrence possibilities.

At step 103000, the controller may perform a read retry operation according to the sorted defect order. The controller may select a read retry set among the plurality of read retry sets included in the read retry table, according to the sorted defect order, and perform a read retry operation on the storage region where the read error occurred, using the selected read retry set.

Figure 28:
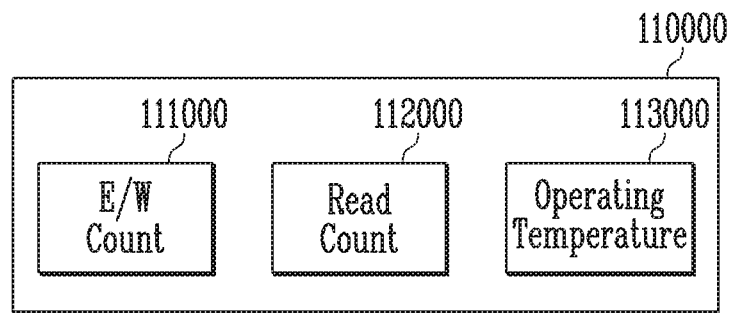
FIG. 28 is a diagram illustrating a status tracker in accordance with an embodiment.

FIG. 28 is a diagram illustrating a status tracker 110000 in accordance with an embodiment. The status tracker 110000 may correspond to the status tracker 72200 illustrated in FIG. 24B and/or the status tracker 82200 illustrated in FIG. 25.

Referring to FIG. 28, the status tracker 110000 may track and write status information on the plurality of storage regions (for example, blocks, dies or pages) included in the memory device. The status tracker 110000 may track and write status information including first to third status values 111000 to 113000. In some embodiments, the status information may include three kinds of status values. However, the present embodiments are not limited thereto.

The first status value 111000 may include an erase/write (E/W) cycle count. The E/W cycle count may include an E/W cycle count for one block. The second status value 112000 may include a read count. The read count may include a read count for one page. The third status value 113000 may include an operating temperature. The operating temperature may include a temperature value measured by the controller or flash array 85000 of the SSD 80000.

FIG. 29 is a diagram illustrating an example in which status information is written for each of the storage regions of the memory device by the status tracker 110000 illustrated in FIG. 28. In various embodiments, the status information may be stored in a table (not shown) within the status tracker 110000 or out of the status tracker 110000.

Referring to FIG. 29, various status information may be written for each of the plurality of regions (for example, N regions) included in the memory device. The various status information may include an erase/write (E/W) count, read count and operating temperature which have been described with reference to FIG. 28.

FIG. 30 is a diagram illustrating an example in which the occurrence possibility of a read error is decided in each of the storage regions based on the possibilities of each possible defect in each region included in a memory device in accordance with an embodiment. This determination may be performed by the read retry unit 72400 illustrated in FIG. 24B and/or the read retry unit 83200 illustrated in FIG. 25.

Referring to FIG. 30, the read retry unit may determine the occurrence possibilities (or probabilities) for a plurality of different type of defects, respectively, based on the status information on the plurality of storage regions included in the memory device, and store the decision results in the form of a table. Such a table may be updated in response to when the status information on each of the storage regions is updated by the status tracker 72200 or 82200.

For the first storage region Region1, a first defect may have the highest occurrence possibility, a second defect may have the second highest occurrence possibility, a third defect may have the third highest occurrence possibility, and a fourth defect may have the lowest occurrence possibility. That is, the occurrence possibilities for the first storage region Region1 may have an order of Defect1→Defect2→Defect3→Defect4.

For the second storage region Region2, the second defect may have the highest occurrence possibility, the first defect may have the second highest occurrence possibility, the third defect may have the third highest occurrence possibility, and the fourth defect may have the lowest occurrence possibility. That is, the occurrence possibilities for the second storage region Region2 may have an order of Defect2→Defect1→Defect3→Defect4.

For the third storage region Region3, the third defect may have the highest occurrence possibility, the fourth defect may have the second highest occurrence possibility, the first defect may have the third highest occurrence possibility, and the second defect may have the lowest occurrence possibility. That is, the occurrence possibilities for the third storage region Region3 may have an order of Defect3→Defect4→Defect1→Defect2.

For the Nth storage region RegionN, the fourth defect may have the highest occurrence possibility, the third defect may have the second highest occurrence possibility, the second defect may have the third highest occurrence possibility, and the first defect may have the lowest occurrence possibility. That is, the occurrence possibilities for the Nth storage region RegionN may have an order of Defect4→Defect3→Defect2→Defect1.

In an embodiment, the read retry unit may normalize possibility decision elements of the corresponding storage region (e.g., block or page) to values between 1 and 100, and compare the normalized possibility decision elements to result values obtained by multiplying given weights by the respective defects, thereby determining the occurrence possibilities (or occurrence probabilities) for the respective defects. The read retry unit may determine that a defect having a relatively large result value has a higher occurrence possibility than a defect having a relatively small result value. The read retry unit can determine occurrence possibilities for the following four kinds of defects.

(Defect 1) Endurance (EN)

1-1) Possibility decision element: E/W cycle count of block 1-2) $EN=W^{EN}*$(Current E/W Cycle/Max allowable E/W Cycle)*100

Here, Current E/W Cycle may represent the current E/W cycle, and Max allowable E/W Cycle may represent the maximum allowable E/W cycle.

(Defect 2) Read Disturb (RD)

2-1) Possibility decision element: read count for one page 2-2) $RD=W^{RD}*$(Current read count/Max allowable read count)*100

Here, Current read count may represent the current read count, and Max allowable read count may represent the maximum allowable read count.

(Defect 3) cross temperature (CT)

3-1) Possibility decision element: temperature difference between when page is written and when page is read 3-2) $CT=W^{CT}*$((Read Temp.−Write Temp.)/(Max Operating Temp.−Min Operating Temp.))*100

Here, Read Temp. may represent a temperature value during the read operation, Write Temp. may represent a temperature value during the write operation, Max Operating Temp. may represent the maximum operating temperature value, and Min Operating Temp. may represent the minimum operating temperature value.

(Defect 4) data retention (DR)

4-1) Possibility decision element: elapsed time after block is written 4-2) Time cannot be measured during DR (=Power Off)

(Defect5) Open Block Case with Above Error Conditions 5-1) When all blocks are not written, the characteristic differs from when all of the blocks are written. Thus, this case needs a sign.

5-2) When the corresponding block is an open block in case of a read error, a flag is set.

Here, $W^{EN}$, $W^{RD}$ and $W^{CT}$ may represent weights for comparing defect elements one to one, the defect elements having different levels of influence on a shift of Vth distribution. The weights may be acquired through a test.

In various embodiments, since there are no methods capable of measuring a time during power-off in the case of data retention, the read retry unit may preferentially consider the data retention when the values of the other three defect elements correspond to such a level that causes a fail.

After the occurrence possibilities for the respective defects are determined in each of the storage regions, the read retry unit may perform read retry operations according to the occurrence possibilities.

The read retry unit may sort the normalized values for the respective defects in descending order, and decide an application order for the entries of the read retry table according to the sorted order. That is, the read retry unit may select a read retry set among the plurality of read retry sets included in the read retry table, according to the sorted defect order, and perform a read retry operations using the selected read retry set. For example, when the occurrence possibilities for the defects have a relation of RD>EN>CT, the read retry unit may perform read retry operations by applying the corresponding read retry sets in order of Read Disturb Endurance Temperature. Furthermore, the read retry unit may determine the application order of the read retry sets even for the same defect, according to the normalized values. For example, when the value of the normalized read disturb RD is 50, the read retry unit can preferentially apply a read retry value corresponding to an intermediate level of read disturb. Also, when a read error occurred even though the normalized values of EN, RD and CT are all equal to or less than reference values, the read retry unit may consider the data retention. Furthermore, the read retry unit may check an open block flag, and apply EN, DR, RD and CT read retry operations reflecting the characteristic of the open block when the open block flag is set.

FIG. 31 is a diagram illustrating an example in which a read retry table 140000 is provided for a plurality of defect types in accordance with an embodiment. For example, the read retry table 140000 may correspond to the read retry table 73000 illustrated in FIG. 24A and/or the read retry table 83400 illustrated in FIG. 25.

Referring to FIG. 31, the read retry table 140000 may include a plurality of read retry (RR) sets. For example, the read retry table 140000 may include K read retry sets 141000 to 146000. The plurality of read retry sets may correspond to a plurality of defect types, respectively. For example, the first read retry set 141000 may correspond to the first defect of FIG. 30, the second read retry set 142000 may correspond to the second defect of FIG. 30, the third read retry set 143000 may correspond to the third defect of FIG. 30, and the fourth read retry set 144000 may correspond to the fourth defect of FIG. 30.

The read retry unit may sort the plurality of defects in descending order of occurrence possibility, and perform read retry operations in the sorted defect order. That is, the read retry unit may select read retry sets among the plurality of read retry sets according to the sorted defect order, and perform the read retry operations using the selected read retry set.

For example, the present embodiment may be based on the supposition that the first to fourth read retry sets 141000 to 144000 correspond to the first to fourth defects illustrated in FIG. 30, respectively. Under such a supposition, when the occurrence possibilities for the first storage region Region1 have an order of Defect1–Defect2–Defect3–Defect4 as illustrated in FIG. 30, the read retry unit may select the read retry sets in an order of the first read retry set 141000→the second read retry set 142000→the third read retry set 143000→the fourth read retry set 144000.

For another example, when the occurrence possibilities for the second storage region Region2 have an order of Defect2→Defect1→Defect3→Defect4 as illustrated in FIG. 30, the read retry unit may select the read retry sets in an order of the second read retry set 142000→the first read retry set 141000→the third read retry set 143000→the fourth read retry set 144000.

For another example, when the occurrence possibilities for the third storage region Region3 have an order of Defect3→Defect4→Defect1→Defect2 as illustrated in FIG. 30, the read retry unit may select the read retry sets in an order of the third read retry set 143000→the fourth read retry set 144000→the first read retry set 141000→the second read retry set 142000.

For another example, when the occurrence possibilities for the Nth storage region RegionN have an order of Defect4→Defect3→Defect2→Defect1 as illustrated in FIG. 30, the read retry unit may select the read retry sets in an order of the fourth read retry set 144000→the third read retry set 143000 the second read retry set 142000→the first read retry set 141000.

Figure 32:
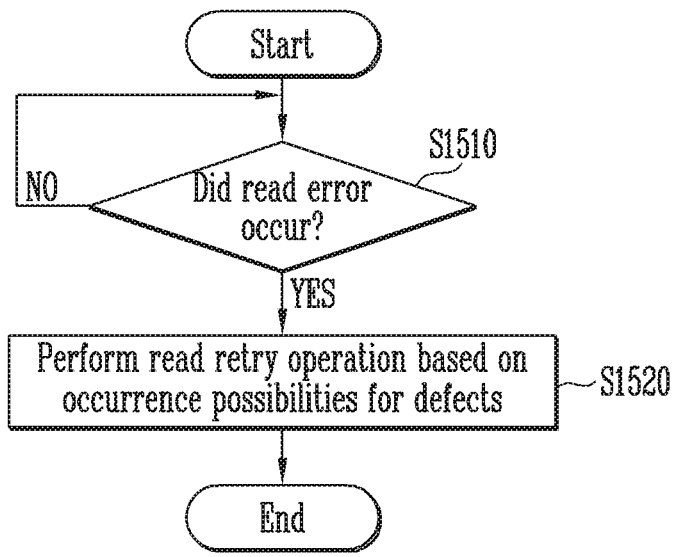
FIG. 32 is a flowchart illustrating a read retry operation in accordance with an embodiment.

FIG. 32 is a flowchart illustrating a read retry operation in accordance with an embodiment. This operation may be performed by the memory controller 71000 illustrated in FIGS. 24A and 24B and/or the controller of the SSD 80000 illustrated in FIG. 25. Hereafter, the memory controller 71000 and the controller of the SSD 80000 will be collectively referred to as "controller".

Referring to FIG. 32, the controller may determine whether a read error occurred in any one storage region among a plurality of storage regions included in a memory device, at step S1510. When determining that a read error occurred, the controller may perform read retry operations based on occurrence possibilities for a plurality of different type of defects, respectively, in the any one storage region, at step 51520.

In various embodiments, the controller may determine the occurrence possibilities for the respective defects based on status information on the any one storage region. The status information may include one or more of an erase/write (E/W) cycle count, a read count and temperature information.

In various embodiments, the controller may sort the plurality of defects in descending order of the occurrence possibilities, and perform read retry operations in the sorted defect order.

In various embodiments, the controller may select a read retry set among the plurality of read retry sets included in the read retry table, according to the sorted defect order, and perform a read retry operation on the any one storage region using the selected read retry set.

In various embodiments, the controller may normalize possibility decision elements of the respective defects, and decide the occurrence possibilities for the respective defects by multiplying given weights by the normalized possibility decision elements.

In various embodiments, the plurality of defects may include two or more of a first defect related to the E/W cycle count, a second defect related to the read count, a third defect related to a difference in temperature between during read operation and during write operation, and a fourth defect related to an elapsed time after write operation. In various embodiments, the controller may select the fourth defect when the values of the possibility decision elements for the first to third defects are smaller than predetermined values, respectively, and perform a read retry operation on the any one storage region using the read retry set corresponding to the selected fourth set.

Figure 33:
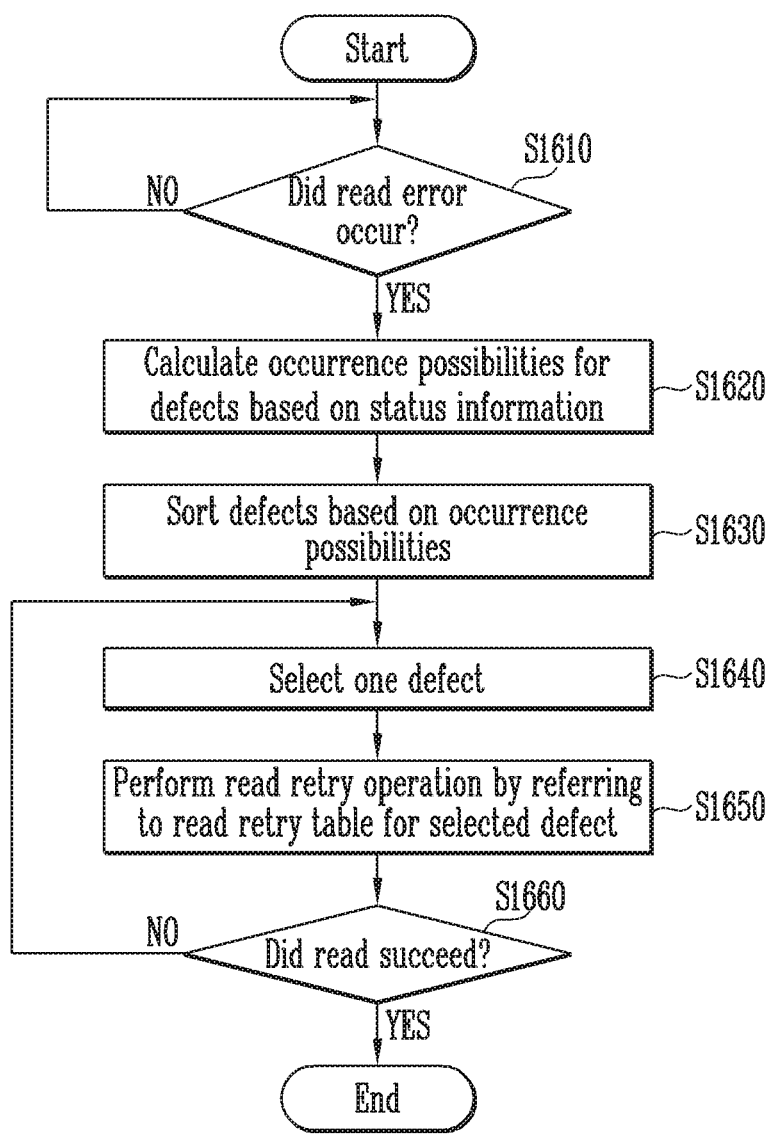
FIG. 33 is a flowchart illustrating a read retry operation in accordance with another embodiment.

FIG. 33 is a flowchart illustrating a read retry operation in accordance with another embodiment. This operation may be performed by the memory controller 71000 illustrated in FIGS. 24A and 24B and/or the controller of the SSD 80000 illustrated in FIG. 25. Hereafter, the memory controller 71000 and the controller of the SSD 80000 will be collectively referred to as "controller".

Referring to FIG. 33, the controller may determine whether a read error occurred in any one storage region among a plurality of storage regions included in a memory device, at step S1610. When determining that a read error occurred, the controller may calculate occurrence possibilities for a plurality of different type of defects, respectively, based on status information on the storage region where the read error occurred, at step S1620. The status information may include one or more of an erase/write (E/W) cycle count, a read count and temperature information. In various embodiments, the controller may normalize the possibility decision elements of the respective defects, and decide the occurrence possibilities for the respective defects by multiplying given weights by the normalized possibility decision elements.

At step S1630, the controller may sort the plurality of defects in descending order of the occurrence possibilities. In various embodiments, the plurality of defects may include two or more of a first defect related to the E/W cycle count, a second defect related to the read count, a third defect related to a difference in temperature between during read operation and during write operation, and a fourth defect related to an elapsed time after write operation.

At step S1640, the controller may select the defect having the highest occurrence possibility among the sorted defects. At step S1650, the controller may select the read retry set corresponding to the selected defect, and perform a read retry operation on the any one storage region using the selected read retry set. At step S1660, the controller may determine whether the read operation has been successfully performed as the result of the read retry operation, at step S1650.

When the read retry operation result indicates that the read operation has been successfully performed, the procedure may be ended. Otherwise, the procedure may return to step S1640.

After returning to step S1640, the controller may select the defect having the second highest occurrence possibility among the sorted defects, select the read retry set corresponding to the selected defect, and perform a read retry operation on the any one storage region using the selected read retry set.

The read retry method in accordance with the various embodiments can determine occurrence possibilities for the respective defect types when a read error occurred, and perform read retry operations in descending order of the occurrence possibilities. The read retry method in accordance with the present embodiments can predict defects which are likely to occur in each of the storage regions of the memory device, and perform read retry operations from the read retry operation for the defect having the highest occurrence possibility, thereby shortening the time required for error correction. Furthermore, the read retry method in accordance with the present embodiments can uniformize correction times for different read errors, and thus improve the quality of service (QoS) of a read request.

Hereinafter, a data processing system and electronic equipment provided with the memory system 11000 including the memory device 15000 and the controller 13000 described with reference to FIGS. 18 to 33 in accordance with an embodiment will be described in more detail with reference to FIGS. 34 to 42.

FIGS. 34 to 42 are diagrams schematically illustrating application examples of the data processing system of FIG. 18 in accordance with various embodiments of the present disclosure.

Figure 34:
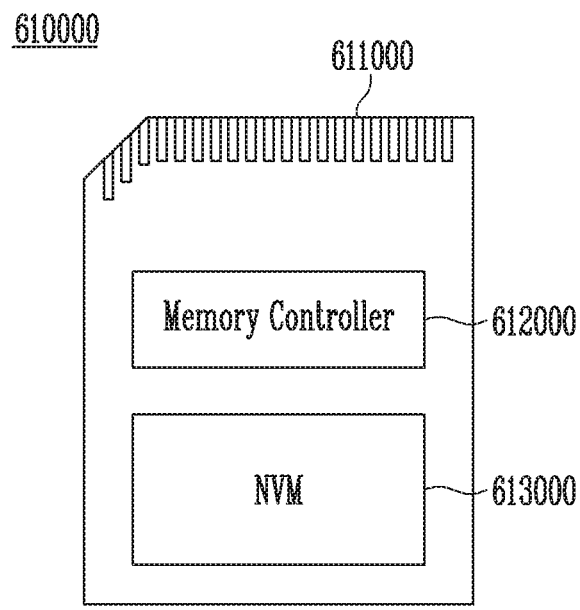
FIGS. 34 to 42 are diagrams schematically illustrating application examples of the data processing system of FIG. 18 in accordance with various embodiments of the present disclosure.

FIG. 34 is a diagram schematically illustrating another example of the data processing system including the memory system in accordance with an embodiment of the present disclosure. FIG. 34 schematically illustrates a memory card system to which the memory system in accordance with an embodiment is applied.

Referring to FIG. 34, the memory card system 610000 may include a connector 611000, a memory controller 612000, and a memory device 613000.

More specifically, the memory controller 612000 may be connected to the memory device 613000 embodied by a nonvolatile memory, and configured to access the memory device 613000. For example, the memory controller 612000 may be configured to control read, write, erase and background operations of the memory device 613000. The memory controller 612000 may be configured to provide an interface between the memory device 613000 and a host, and drive firmware for controlling the memory device 613000. That is, the memory controller 612000 may correspond to the controller 13000 of the memory system 11000 described with reference to FIG. 18, and the memory device 613000 may correspond to the memory device 15000 of the memory system 11000 described with reference to FIG. 18.

Thus, the memory controller 612000 may include a random access memory (RAM), a processing unit, a host interface, a memory interface and an error correction unit. The memory controller 13000 may further include the elements shown in FIG. 22.

The memory controller 612000 may communicate with an external device, for example, the host 10200 of FIG. 18 through the connector 611000. For example, as described with reference to FIG. 18, the memory controller 612000 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (WI-FI) and Bluetooth. Thus, the memory system and the data processing system in accordance with an embodiment may be applied to wired/wireless electronic devices or particularly mobile electronic devices.

The memory device 613000 may be implemented by a nonvolatile memory. For example, the memory device 613000 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 613000 may include a plurality of dies as in the memory device 15000 of FIG. 18.

The memory controller 612000 and the memory device 613000 may be integrated into a single semiconductor device. For example, the memory controller 612000 and the memory device 613000 may construct a solid state drive (SSD) by being integrated into a single semiconductor device. Also, the memory controller 612000 and the memory device 613000 may construct a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 35:
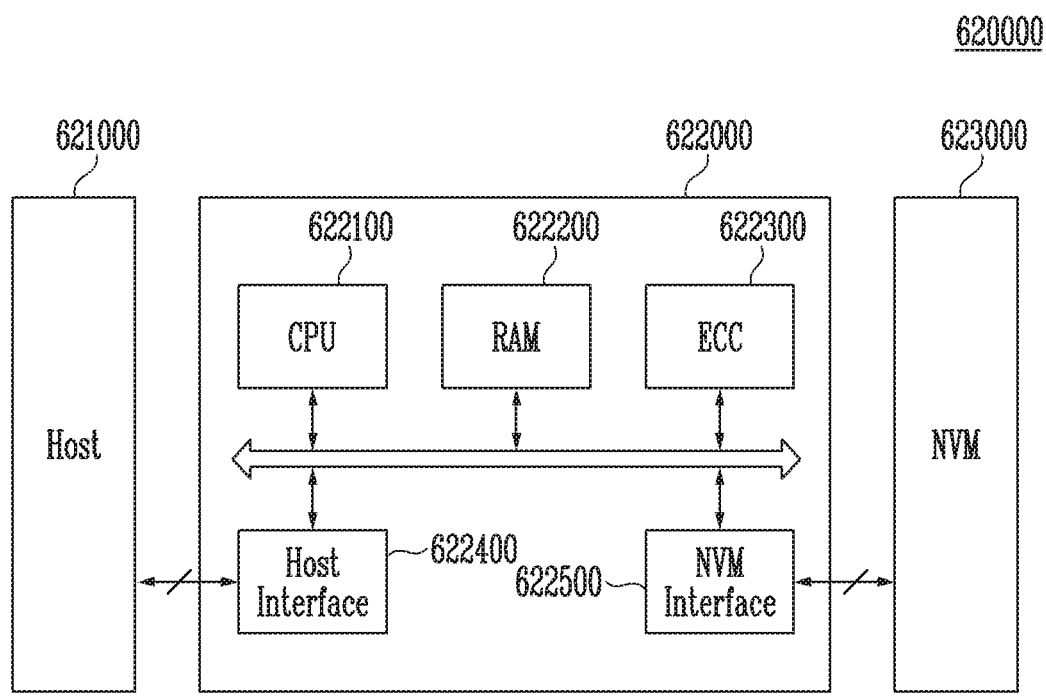

FIG. 35 is a diagram schematically illustrating another example of the data processing system including the memory system in accordance with an embodiment of the present disclosure.

Referring to FIG. 35, the data processing system 620000 may include a memory device 623000 having one or more nonvolatile memories (NVMs) and a memory controller 622000 for controlling the memory device 623000. The data processing system 620000 illustrated in FIG. 30 may serve as a storage medium such as a memory card (e.g., CF, SD, micro-SD or the like) or USB device, as described with reference to FIG. 18. The memory device 623000 may correspond to the memory device 15000 in the memory system 11000 illustrated in FIG. 18, and the memory controller 622000 may correspond to the controller 13000 in the memory system 11000 illustrated in FIG. 18.

The memory controller 622000 may control a read, write or erase operation on the memory device 623000 in response to a request of the host 621000, and the memory controller 622000 may include a central processing unit (CPU) 622100, a random access memory (RAM) as a buffer memory 622200, an error correction code (ECC) circuit 622300, a host interface 622400 and an NVM interface as a memory interface 622500.

The CPU 622100 may control overall operations on the memory device 623000, for example, read, write, file system management and bad page management operations. The RAM 622200 may be operated according to control of the CPU 622100, and used as a work memory, buffer memory or cache memory. When the RAM 622200 is used as a work memory, data processed by the CPU 622100 may be temporarily stored in the RAM 622200. When the RAM 622200 is used as a buffer memory, the RAM 622200 may be used for buffering data transmitted to the memory device 623000 from the host 621000 or transmitted to the host 621000 from the memory device 623000. When the RAM 622200 is used as a cache memory, the RAM 622200 may assist the low-speed memory device 623000 to operate at high speed.

The ECC circuit 622300 may correspond to the ECC unit 13800 of the controller 13000 illustrated in FIG. 18, As described with reference to FIG. 18, the ECC circuit 622300 may generate an error correction code for correcting a fail bit or error bit of data provided from the memory device 623000. The ECC circuit 622300 may perform error correction encoding on data provided to the memory device 623000, thereby forming data with a parity bit. The parity bit may be stored in the memory device 623000. he ECC circuit 622300 may perform error correction decoding on data outputted from the memory device 623000. At this time, the ECC circuit 622300 may correct an error using the parity bit. For example, as described with reference to FIG. 18, the ECC circuit 622300 may correct an error using any suitable method including a coded modulation such as a low density parity check (LDPC) code, a Bose-Chaudhuri-Hocquenghem (BCH) code, a turbo code, Reed-Solomon (RS) code, a convolution code, a recursive systematic code (RSC), a trellis-coded modulation (TCM) or a Block coded modulation (BCM).

The memory controller 622000 may transmit/receive data to/from the host 621000 through the host interface 622400, and transmit/receive data to/from the memory device 623000 through the NVM interface 622500. The host interface 622400 may be connected to the host 621000 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface, The memory controller 622000 may have a wireless communication function with a mobile communication protocol such as wireless fidelity (WI-FI) or long term evolution (LTE). The memory controller 622000 may be connected to an external device, for example, the host 621000 or another external device, and then transmit/receive data to/from the external device. In particular, as the memory controller 622000 is configured to communicate with the external device through one or more of various communication protocols, the memory system and the data processing system in accordance with an embodiment may be applied to wired/wireless electronic devices or particularly a mobile electronic device.

Figure 36:
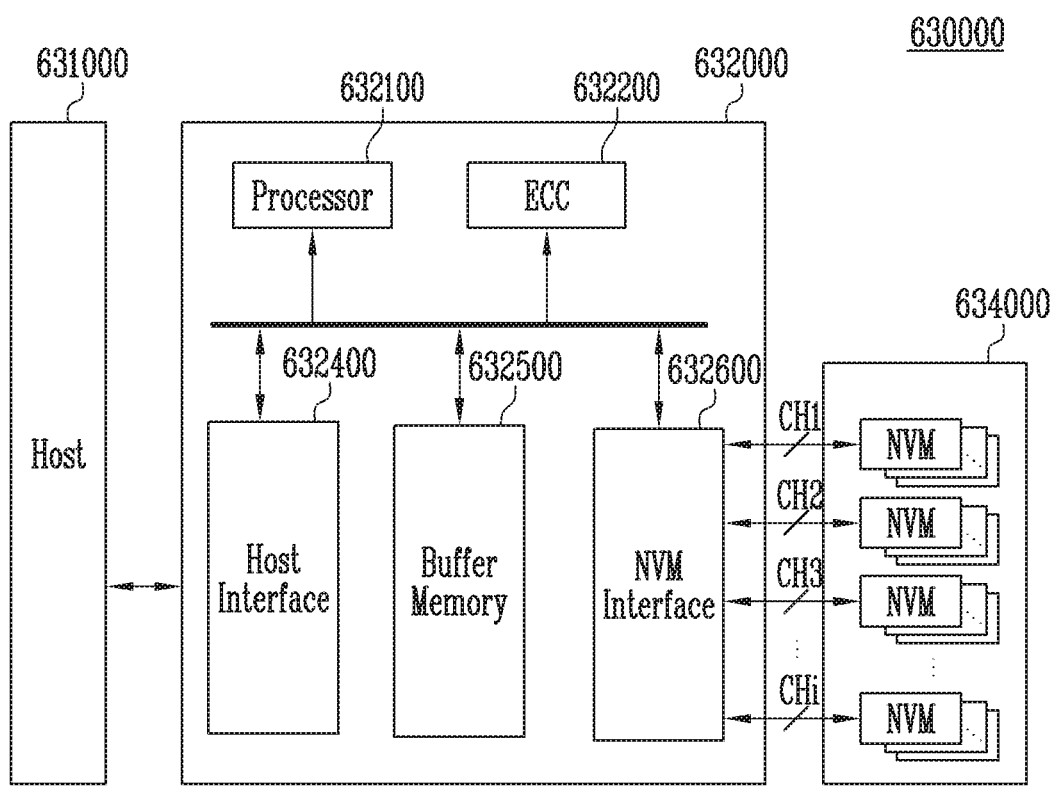

FIG. 36 is a diagram schematically illustrating another example of the data processing system including the memory system in accordance with an embodiment of the present disclosure. FIG. 36 schematically illustrates a solid state drive (SSD) 630000 to which the memory system in accordance with an embodiment is applied.

Referring to FIG. 36, the SSD 630000 may include a controller 632000 and a memory device 634000 including a plurality of nonvolatile memories. The controller 632000 may correspond to the controller 13000 in the memory system 11000 of FIGS. 18 and 22, and the memory device 634000 may correspond to the memory device 15000 in the memory system of FIG. 18.

More specifically, the controller 632000 may be connected to the memory device 634000 through a plurality of channels CH1 to CHi. The controller 632000 may include a processor 632100, a buffer memory 632500, an error correction code (ECC) circuit 632200, a host interface 632400 and a nonvolatile memory interface as a memory interface 632600.

The buffer memory 632500 may temporarily store data provided from the host 631000 or data provided from a plurality of flash memories NVM included in the memory device 634000, or temporarily store meta data of the plurality of flash memories NVM, for example, map data including a mapping table. The buffer memory 632500 may be embodied by volatile memories such as a dynamic random access memory (DRAM), a synchronous dynamic random access memory (SDRAM), a double data rate (DDR) SDRAM, a low power double data rate (LPDDR) SDRAM and graphic random access memory (GRAM) or nonvolatile memories such as a ferroelectric random access memory (FRAM), a resistive random access memory (ReRAM), a spin-transfer torque magnetic random access memory (STT-MRAM) and a phase change random access memory (PRAM). For convenience of description, FIG. 36 illustrates that the buffer memory 632500 exists in the controller 632000. However, the buffer memory 632500 may exist outside the controller 632000.

The ECC circuit 632200 may calculate an ECC value of data to be programmed to the memory device 634000 during a program operation, perform an error correction operation on data read from the memory device 634000 based on the ECC value during a read operation, and perform an error correction operation on data recovered from the memory device 634000 during a failed data recovery operation.

The host interface 632400 may provide an interface function with an external device, for example, the host 631000, and the nonvolatile memory interface 632600 may provide an interface function with the memory device 634000 connected through the plurality of channels.

Furthermore, a plurality of SSDs 630000 to which the memory system 11000 of FIG. 18 is applied may be provided to embody a data processing system, for example, a redundant array of independent disks (RAID) system. At this time, the RAID system may include the plurality of SSDs 630000 and a RAID controller for controlling the plurality of SSDs 630000. When the RAID controller performs a program operation in response to a write command provided from the host 631000, the RAID controller may select one or more memory systems or SSDs 630000 according to a plurality of RAID levels, that is, RAID level information of the write command provided from the host 631000 in the SSDs 630000, and output data corresponding to the write command to the selected SSDs 630000. Furthermore, when the RAID controller performs a read command in response to a read command provided from the host 631000, the RAID controller may select one or more memory systems or SSDs 630000 according to a plurality of RAID levels, that is, RAID level information of the read command provided from the host 631000 in the SSDs 630000, and provide data read from the selected SSDs 630000 to the host 631000.

Figure 37:
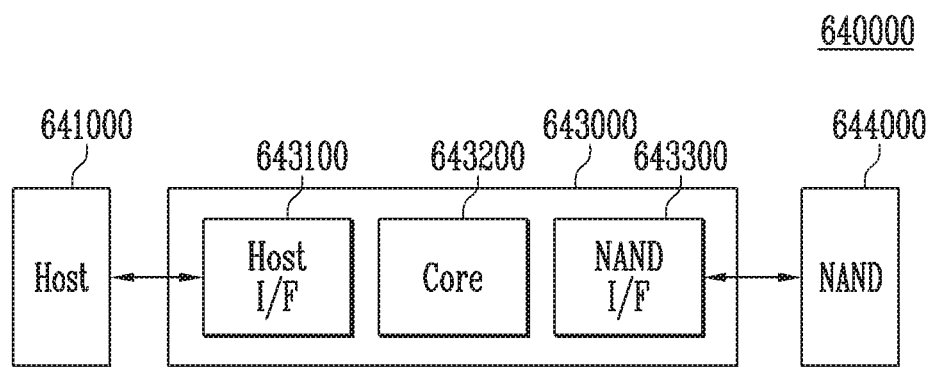

FIG. 37 is a diagram schematically illustrating another example of the data processing system including the memory system in accordance with an embodiment of the present disclosure. FIG. 37 schematically illustrates an embedded Multi-Media Card (eMMC) to which the memory system in accordance with an embodiment is applied.

Referring to FIG. 37, the eMMC 640000 may include a controller 643000 and a memory device 644000 embodied by one or more NAND flash memories. The controller 643000 may correspond to the controller 13000 in the memory system 11000 of FIG. 18, and the memory device 644000 may correspond to the memory device 15000 in the memory system 11000 of FIG. 18.

More specifically, the controller 643000 may be connected to the memory device 644000 through a plurality of channels. The controller 643000 may include one or more cores 643200, a host interface 643100 and a memory interface, for example, a NAND interface 643300.

The core 643200 may control overall operations of the eMMC 640000, the host interface 643100 may provide an interface function between the controller 643000 and the host 641000, and the NAND interface 643300 may provide an interface function between the memory device 644000 and the controller 643000. For example, the host interface 643100 may serve as a parallel interface such as an MMC interface as described with reference to FIG. 18. Furthermore, the host interface 643100 may serve as a serial interface such as an ultra-high speed class 1 (UHS-I)/UHS class 2 (UHS-II) and a universal flash storage (UFS) interface.

FIGS. 38 to 41 are diagrams schematically illustrating other examples of the data processing system including the memory system in accordance with embodiments of the present disclosure. FIGS. 38 to 41 schematically illustrate universal flash storage (UFS) systems to which the memory system in accordance with an embodiment is applied.

Referring to FIGS. 38 to 41, the UFS systems 650000, 660000, 670000 and 680000 may include hosts 651000, 661000, 671000 and 681000, UFS devices 652000, 662000, 672000 and 682000 and UFS cards 653000, 663000, 673000 and 683000, respectively. The hosts 651000, 661000, 671000 and 681000 may serve as application processors of wired/wireless electronic devices or particularly mobile electronic devices, the UFS devices 652000, 662000, 672000 and 682000 may serve as embedded UFS devices, and the UFS cards 653000, 663000, 673000 and 683000 may serve as external embedded UFS devices or removable UFS cards.

The hosts 651000, 661000, 671000 and 681000, the UFS devices 652000, 662000, 672000 and 682000 and the UFS cards 653000, 663000, 673000 and 683000 in the respective UFS systems 650000, 660000, 670000 and 680000 may communicate with external devices, for example, wired and/or wireless electronic devices or particularly mobile electronic devices through UFS protocols, and the UFS devices 652000, 662000, 672000 and 682000 and the UFS cards 653000, 663000, 673000 and 683000 may be embodied by the memory system 11000 illustrated in FIG. 18. For example, in the UFS systems 650000, 660000, 670000 and 680000, the UFS devices 652000, 662000, 672000 and 682000 may be embodied in the form of the data processing system 620000, the SSD 630000 or the eMMC 640000 described with reference to FIGS. 35 to 37, and the UFS cards 653000, 663000, 673000 and 683000 may be embodied in the form of the memory card system 610000 described with reference to FIG. 34.

Furthermore, in the UFS systems 650000, 660000, 670000 and 680000, the hosts 651000, 661000, 671000 and 681000, the UFS devices 652000, 662000, 672000 and 682000 and the UFS cards 653000, 663000, 673000 and 683000 may communicate with each other through an UFS interface, for example, MIPI M-PHY and MIPI Unified Protocol (UniPro) in Mobile Industry Processor Interface (MIPI). Furthermore, the UFS devices 652000, 662000, 672000 and 682000 and the UFS cards 653000, 663000, 673000 and 683000 may communicate with each other through various protocols other than the UFS protocol, for example, USB flash drives (UFDs), multimedia card (MMC), secure digital (SD), mini-SD, and micro-SD.

Figure 38:
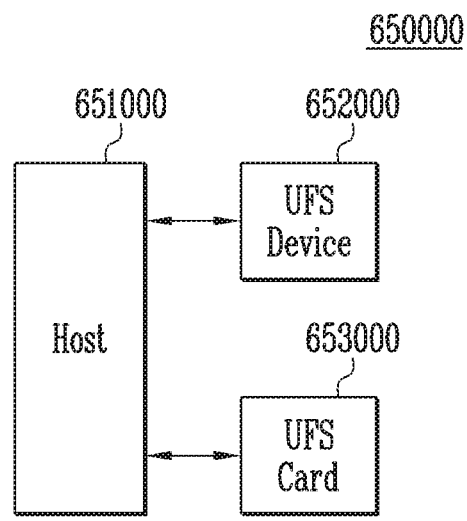

In the UFS system 650000 illustrated in FIG. 38, each of the host 651000, the UFS device 652000 and the UFS card 653000 may include UniPro. The host 651000 may perform a switching operation in order to communicate with the UFS device 652000 and the UFS card 653000. In particular, the host 651000 may communicate with the UFS device 652000 or the UFS card 653000 through link layer switching, for example, L3 switching at the UniPro. At this time, the UFS device 652000 and the UFS card 653000 may communicate with each other through link layer switching at the UniPro of the host 651000. In an embodiment, the configuration in which one UFS device 652000 and one UFS card 653000 are connected to the host 651000 has been exemplified for convenience of description. However, a plurality of UFS devices and UFS cards may be connected in parallel or in the form of a star to the host 641000, and a plurality of UFS cards may be connected in parallel or in the form of a star to the UFS device 652000 or connected in series or in the form of a chain to the UFS device 652000.

Figure 39:
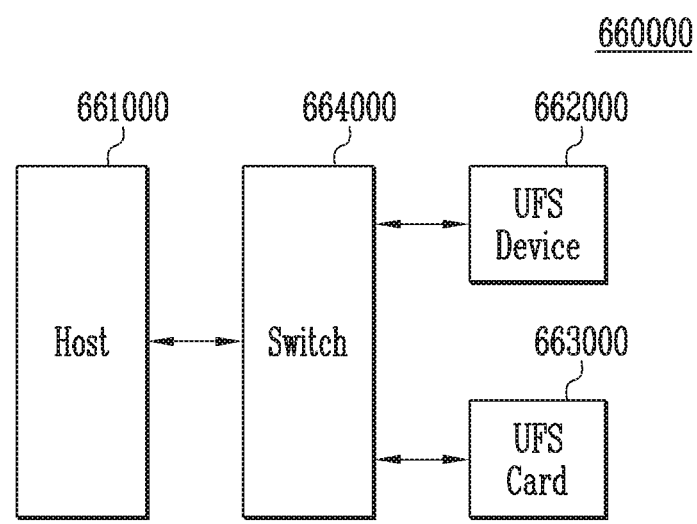

In the UFS system 660000 illustrated in FIG. 39, each of the host 661000, the UFS device 662000 and the UFS card 663000 may include UniPro, and the host 661000 may communicate with the UFS device 662000 or the UFS card 663000 through a switching module 664000 performing a switching operation, for example, through the switching module 664000 which performs link layer switching at the UniPro, for example, L3 switching. The UFS device 662000 and the UFS card 663000 may communicate with each other through link layer switching of the switching module 664000 at UniPro. In an embodiment, the configuration in which one UFS device 662000 and one UFS card 663000 are connected to the switching module 664000 has been exemplified for convenience of description. However, a plurality of UFS devices and UFS cards may be connected in parallel or in the form of a star to the switching module 664000, and a plurality of UFS cards may be connected in series or in the form of a chain to the UFS device 662000.

Figure 40:
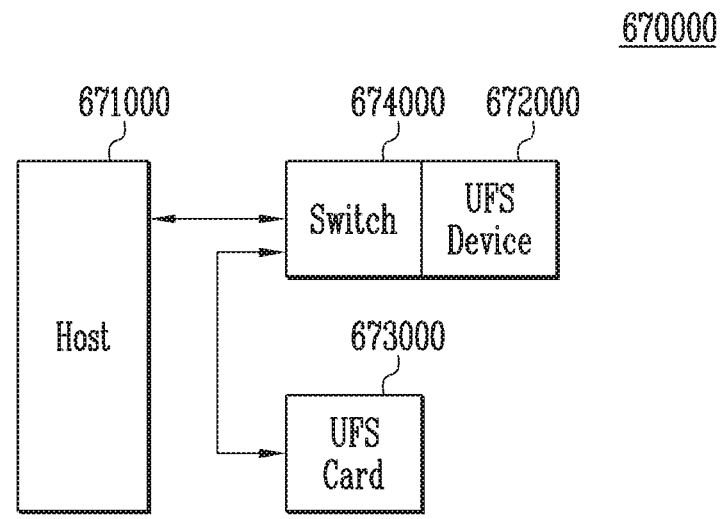

In the UFS system 670000 illustrated in FIG. 40, each of the host 671000, the UFS device 672000 and the UFS card 673000 may include UniPro, and the host 671000 may communicate with the UFS device 672000 or the UFS card 673000 through a switching module 674000 performing a switching operation, for example, through the switching module 674000 which performs link layer switching at the UniPro, for example, L3 switching. At this time, the UFS device 672000 and the UFS card 673000 may communicate with each other through link layer switching of the switching module 674000 at the UniPro, and the switching module 674000 may be integrated as one module with the UFS device 672000 inside or outside the UFS device 672000. In an embodiment, the configuration in which one UFS device 672000 and one UFS card 673000 are connected to the switching module 674000 has been exemplified for convenience of description. However, a plurality of modules each including the switching module 674000 and the UFS device 672000 may be connected in parallel or in the form of a star to the host 671000 or connected in series or in the form of a chain to each other. Furthermore, a plurality of UFS cards may be connected in parallel or in the form of a star to the UFS device 672000.

Figure 41:
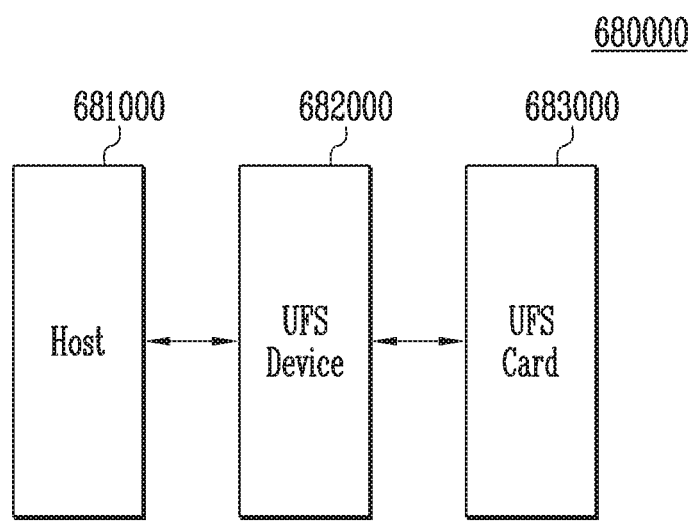

In the UFS system 680000 illustrated in FIG. 41, each of the host 681000, the UFS device 682000 and the UFS card 683000 may include M-PHY and UniPro. The UFS device 682000 may perform a switching operation in order to communicate with the host 681000 and the UFS card 683000. In particular, the UFS device 682000 may communicate with the host 681000 or the UFS card 683000 through a switching operation between the M-PHY and UniPro module for communication with the host 681000 and the M-PHY and UniPro module for communication with the UFS card 683000, for example, through a target identifier (ID) switching operation. At this time, the host 681000 and the UFS card 683000 may communicate with each other through target ID switching between the M-PHY and UniPro modules of the UFS device 682000. In an embodiment, the configuration in which one UFS device 682000 is connected to the host 681000 and one UFS card 683000 is connected to the UFS device 682000 has been exemplified for convenience of description. However, a plurality of UFS devices may be connected in parallel or in the form of a star to the host 681000, or connected in series or in the form of a chain to the host 681000, and a plurality of UFS cards may be connected in parallel or in the form of a star to the UFS device 682000, or connected in series or in the form of a chain to the UFS device 682000.

Figure 42:
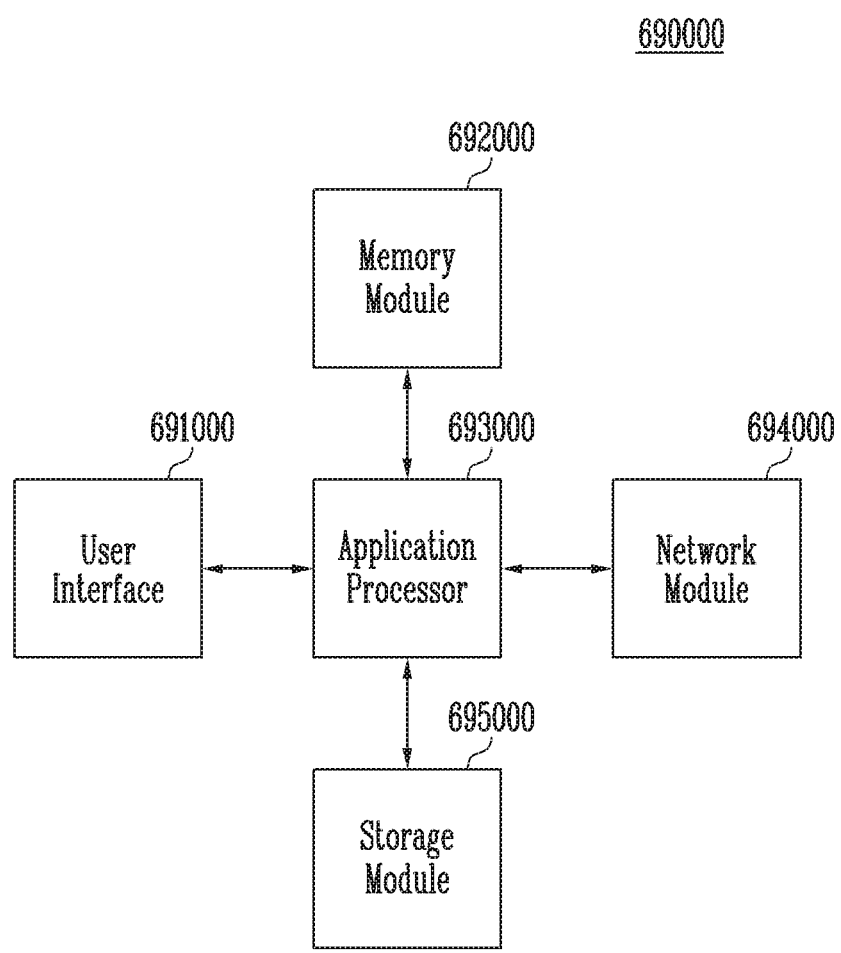

FIG. 42 is a diagram schematically illustrating another example of the data processing system including the memory system in accordance with an embodiment of the present disclosure. FIG. 42 is a diagram schematically illustrating a user system to which the memory system in accordance with an embodiment is applied.

Referring to FIG. 42, the user system 690000 may include an application processor 693000, a memory module 692000, a network module 694000, a storage module 695000 and a user interface 691000.

More specifically, the application processor 693000 may drive components included in the user system 690000, for example, an OS, and include controllers, interfaces and a graphic engine which control the components included in the user system 690000. The application processor 693000 may be provided as System-on-Chip (SoC).

The memory module 692000 may be used as a main memory, work memory, buffer memory or cache memory of the user system 690000. The memory module 692000 may include a volatile RAM such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDARM, an LPDDR2 SDRAM and an LPDDR3 SDRAM or a nonvolatile RAM such as a phase change random access memory (PRAM), a resistive random access memory (ReRAM), a magnetic random access memory (MRAM) and a ferroelectric random access memory (FRAM). For example, the application processor 693000 and the memory module 692000 may be packaged and mounted, based on a package-on-package (POP).

The network module 694000 may communicate with external devices. For example, the network module 694000 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired and/or wireless electronic devices or particularly mobile electronic devices. Therefore, the memory system and the data processing system, in accordance with an embodiment of the present invention, can be applied to wired and/or wireless electronic devices. The network module 694000 may be included in the application processor 693000.

The storage module 695000 may store data, for example, data provided from the application processor 693000, and then may transmit the stored data to the application processor 693000. The storage module 695000 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 690000. The storage module 695000 may correspond to the memory system 11000 described with reference to FIG. 18. Furthermore, the storage module 6950 may be embodied as an SSD, eMMC and UFS as described above with reference to FIGS. 36 to 41.

The user interface 691000 may include interfaces for inputting data or commands to the application processor 693000 or outputting data to an external device. For example, the user interface 691000 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMO-LED) display device, a light emitting diode (LED), a speaker and a motor.

Furthermore, when the memory system 11000 of FIG. 18 is applied to a mobile electronic device of the user system 690000, the application processor 693000 may control overall operations of the mobile electronic device, and the network module 694000 may serve as a communication module for controlling wired and/or wireless communication with an external device. The user interface 691000 may display data processed by the processor 693000 on a display/touch module of the mobile electronic device, or support a function of receiving data from the touch panel.

Although various embodiments have been described for illustrative purposes, it will be apparent to those skilled in the art that various other embodiments, changes and modifications thereof may be made without departing from the spirit and scope of the invention as defined in the following claims.

What is claimed is:

1. A memory system comprising:
a memory device configured to include a plurality of memory blocks each including memory cells; and
a memory controller configured to calculate numbers of memory cells included in a selected page among the plurality of memory blocks, respectively included in a plurality of threshold voltage regions divided by first read voltages and second read voltages, to determine a read retry set to be used to read data stored in the selected page among a plurality of read retry sets based on the numbers of memory cells respectively included in the plurality of threshold voltage regions, and to control the memory device to perform a read retry operation using the read retry set.

2. The memory system of claim 1, wherein the memory controller includes:
a memory interface configured to provide a user read command to the memory device; and
a state counter configured to receive first data and second data, which are acquired by read operations on the selected page, based on the first read voltages and the second read voltages.

3. The memory system of claim 2, wherein the state counter generates a count result by counting the numbers of memory cells respectively included in the plurality of threshold voltage regions divided by the first read voltages and the second read voltages.

4. The memory system of claim 3, wherein the memory controller further includes:
a status tracker configured to track and generate status information on the plurality of memory blocks, respectively, based on the count result;
a read retry table including the plurality of read retry sets; and
a read retry unit configured to select the read retry set among the plurality of read retry sets based on the status information.

5. The memory system of claim 3, wherein the status information includes at least one of an erase/write (E/W) cycle count, a read count or temperature information.

6. The memory system of claim 5, wherein the E/W cycle count includes an E/W cycle count for each memory block included in the memory device.

7. The memory system of claim 5, wherein the read count includes a read count value for each page of the plurality of memory blocks.

8. The memory system of claim 5, wherein the temperature information includes information on a temperature measured in the memory device.

9. The memory system of claim 1, wherein the memory device generates the first read voltages and the second read voltages, based on initial read voltages and first and second offset voltages, in response to a user read command from the memory controller, and outputs first data and second data, which are acquired by read operations on the selected page, based on the first read voltages and the second read voltages.

10. The memory system of claim 9, wherein the read operations on the selected page include MSB read operations and LSB read operations, and
wherein the first data is generated through one of the MSB read operations and one of the LSB read operations, which are performed based on the first read voltages.

11. The memory system of claim 10, wherein the one of/each of the MSB read operations is performed using two different voltages among the first read voltages, and one bit is generated from each of multi-bit memory cells.

12. A method for memory controller controlling a memory device including a plurality of memory blocks including memory cells, respectively, the method comprising:
providing a user read command;
receiving first data and second data, which are acquired by read operations on a selected page among the plurality of memory blocks, using first read voltages and second read voltages, in response to the user read command;
counting numbers of memory cells of the selected page respectively included in a plurality of threshold voltage regions divided by the first read voltages and the second read voltages;
selecting a read retry set among a plurality of read retry sets based on the numbers of memory cells; and
controlling the memory device to perform a read retry operation using the read retry set.

* * * * *